United States Patent
van Schravendijk et al.

(10) Patent No.: US 10,566,186 B2
(45) Date of Patent: Feb. 18, 2020

(54) METHODS OF ENCAPSULATION

(71) Applicant: Lam Research Corporation, Fremont, CA (US)

(72) Inventors: Bart J. van Schravendijk, Palo Alto, CA (US); Akhil Singhal, Portland, OR (US); Joseph Hung-chi Wei, Portland, OR (US); Bhadri N. Varadarajan, Beaverton, OR (US); Kevin McLaughlin, Sherwood, OR (US); Casey Holder, Oakland, CA (US); Ananda Banerji, West Linn, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 16/179,809

(22) Filed: Nov. 2, 2018

(65) Prior Publication Data
US 2019/0157078 A1 May 23, 2019

Related U.S. Application Data

(63) Continuation of application No. 15/279,310, filed on Sep. 28, 2016, now Pat. No. 10,157,736.
(Continued)

(51) Int. Cl.
*H01L 21/02* (2006.01)
*C23C 16/32* (2006.01)
(Continued)

(52) U.S. Cl.
CPC ...... *H01L 21/02274* (2013.01); *C23C 16/325* (2013.01); *C23C 16/345* (2013.01);
(Continued)

(58) Field of Classification Search
CPC ......... H01L 21/02126; H01L 21/02167; H01L 21/0217; H01L 21/02175; H01L 21/0228;
(Continued)

(56) References Cited

U.S. PATENT DOCUMENTS

| 5,314,724 A | 5/1994 | Tsukune et al. |
| 7,019,159 B2 | 3/2006 | Dussarrat et al. |

(Continued)

FOREIGN PATENT DOCUMENTS

| CN | 101997002 A | 3/2011 |
| JP | 2007-281181 A | 10/2007 |

OTHER PUBLICATIONS

U.S. Office Action dated Apr. 18, 2016 issued in U.S. Appl. No. 14/935,317.
(Continued)

*Primary Examiner* — Robert G Bachner
*Assistant Examiner* — Molly K Reida
(74) *Attorney, Agent, or Firm* — Weaver Austin Villeneuve & Sampson LLP

(57) ABSTRACT

Methods and apparatuses suitable for depositing low hydrogen content, hermetic, thin encapsulation layers at temperatures less than about 300° C. are provided herein. Methods involve pulsing plasma while exposing a substrate to deposition reactants, and post-treating deposited encapsulation films to densify and reduce hydrogen content. Post-treatment methods include periodic exposure to inert plasma without reactants and exposure to ultraviolet radiation at a substrate temperature less than about 300° C.

17 Claims, 15 Drawing Sheets

Related U.S. Application Data

(60) Provisional application No. 62/333,054, filed on May 6, 2016.

(51) Int. Cl.

| | | |
|---|---|---|
| *C23C 16/34* | (2006.01) | |
| *C23C 16/56* | (2006.01) | |
| *H01L 43/12* | (2006.01) | |
| *H01L 21/56* | (2006.01) | |
| *H01L 23/29* | (2006.01) | |
| *C23C 16/515* | (2006.01) | |
| *H01J 37/32* | (2006.01) | |
| *C23C 16/50* | (2006.01) | |
| *H01L 43/02* | (2006.01) | |
| *H01L 43/08* | (2006.01) | |

(52) U.S. Cl.
CPC ............ *C23C 16/50* (2013.01); *C23C 16/515* (2013.01); *C23C 16/56* (2013.01); *H01J 37/32009* (2013.01); *H01J 37/3244* (2013.01); *H01J 37/32082* (2013.01); *H01J 37/32155* (2013.01); *H01J 37/32165* (2013.01); *H01L 21/0217* (2013.01); *H01L 21/0228* (2013.01); *H01L 21/0234* (2013.01); *H01L 21/02126* (2013.01); *H01L 21/02167* (2013.01); *H01L 21/02175* (2013.01); *H01L 21/02211* (2013.01); *H01L 21/02348* (2013.01); *H01L 21/56* (2013.01); *H01L 23/291* (2013.01); *H01L 43/02* (2013.01); *H01L 43/08* (2013.01); *H01L 43/12* (2013.01); *H01J 2237/334* (2013.01); *H01J 2237/3321* (2013.01)

(58) Field of Classification Search
CPC ........... H01L 21/0234; H01L 21/02348; C23C 16/32; C23C 16/325; C23C 16/34; C23C 16/345; C23C 16/56
See application file for complete search history.

(56) References Cited

U.S. PATENT DOCUMENTS

| | | |
|---|---|---|
| 7,163,860 B1 | 1/2007 | Kamai et al. |
| 7,372,118 B2 | 5/2008 | Asao et al. |
| 7,745,346 B2 | 6/2010 | Hausmann et al. |
| 8,586,390 B2 | 11/2013 | Tomioka |
| 9,023,737 B2 | 5/2015 | Beynet et al. |
| 9,070,555 B2 | 6/2015 | Hausmann et al. |
| 9,214,333 B1 | 12/2015 | Sims et al. |
| 9,601,693 B1 | 3/2017 | Henri et al. |
| 9,865,815 B2 | 1/2018 | Hausmann et al. |
| 10,141,505 B2 | 11/2018 | Hausmann et al. |
| 10,157,736 B2 | 12/2018 | van Schravendijk et al. |
| 2005/0025885 A1 | 2/2005 | McSwiney et al. |
| 2005/0170104 A1 | 8/2005 | Jung et al. |
| 2005/0227017 A1 | 10/2005 | Senzaki et al. |
| 2007/0054450 A1 | 3/2007 | Hong et al. |
| 2007/0080381 A1 | 4/2007 | Chien et al. |
| 2007/0238316 A1 | 10/2007 | Ohashi |
| 2009/0163041 A1 | 6/2009 | Mungekar et al. |
| 2009/0321708 A1 | 12/2009 | Rho et al. |
| 2010/0099271 A1 | 4/2010 | Hausmann et al. |
| 2010/0102407 A1 | 4/2010 | Kajiyama et al. |
| 2010/0124618 A1 | 5/2010 | Kobayashi et al. |
| 2011/0183528 A1 | 7/2011 | Wang et al. |
| 2012/0104347 A1 | 5/2012 | Quick |
| 2012/0164846 A1 | 6/2012 | Ha et al. |
| 2014/0023794 A1 | 1/2014 | Mahajani et al. |
| 2014/0030448 A1 | 1/2014 | Bowen et al. |
| 2014/0113455 A1 | 4/2014 | Reimer et al. |
| 2014/0273477 A1 | 9/2014 | Niskanen et al. |
| 2014/0273529 A1 | 9/2014 | Nguyen et al. |
| 2014/0273530 A1 | 9/2014 | Nguyen et al. |
| 2014/0356549 A1 | 12/2014 | Varadarajan |
| 2015/0137061 A1 | 5/2015 | Donghi et al. |
| 2015/0243708 A1 | 8/2015 | Ravasio et al. |
| 2015/0259791 A1 | 9/2015 | Hausmann et al. |
| 2016/0046501 A1 | 2/2016 | Kverel et al. |
| 2016/0079054 A1 | 3/2016 | Chen et al. |
| 2016/0093484 A1 | 3/2016 | Marsh |
| 2016/0284567 A1 | 9/2016 | Reilly et al. |
| 2017/0092857 A1 | 3/2017 | Hausmann |
| 2017/0323785 A1 | 11/2017 | Singhal et al. |
| 2017/0323803 A1 | 11/2017 | van Schravendijk et al. |
| 2018/0114903 A1 | 4/2018 | Hausmann |
| 2018/0138405 A1 | 5/2018 | McKerrow et al. |

OTHER PUBLICATIONS

U.S. Notice of Allowance dated Sep. 19, 2016 issued in U.S. Appl. No. 14/935,317.
U.S. Office Action dated May 19, 2017 issued in U.S. Appl. No. 15/272,222.
U.S. Notice of Allowance dated Sep. 1, 2017 issued in U.S. Appl. No. 15/272,222.
U.S. Office Action dated Apr. 7, 2017 issued in U.S. Appl. No. 15/279,314.
U.S. Final Office Action dated Oct. 19, 2017 issued in U.S. Appl. No. 15/279,314.
U.S. Office Action dated Jul. 3, 2017 issued in U.S. Appl. No. 15/279,310.
U.S. Final Office Action dated Feb. 21, 2018 issued in U.S. Appl. No. 15/279,310.
U.S. Notice of Allowance dated Aug. 15, 2018 issued in U.S. Appl. No. 15/279,310.
U.S. Notice of Allowance dated Jul. 26, 2018 issued in U.S. Appl. No. 15/829,702.
U.S. Final Office Action dated Apr. 20, 2018 issued in U.S. Appl. No. 15/349,753.
U.S. Office Action dated Sep. 28, 2018 issued in U.S. Appl. No. 15/349,753.
U.S. Appl. No. 16/112,503, filed Aug. 24, 2018, Sims et al.
U.S. Office Action dated Oct. 23, 2017 issued in U.S. Appl. No. 15/349,753.
U.S. Notice of Allowance dated Jun. 17, 2019 issued in U.S. Appl. No. 15/349,753.
Chinese First Office Action dated Feb. 20, 2019 issued in Application No. CN 201710316752.2.
International Search Report and Written Opinion dated Feb. 21, 2018 issued in Application No. PCT/US2017/060240.
International Preliminary Report on Patentability dated May 23, 2019 issued in Application No. PCT/US2017/060240.
Aboaf, J.A. (1969) "Some Properties of Vapor Deposited Silicon Nitride Films Obtained by the Reaction of SiBr4 and NH 3," *Journal of the Electrochemical Society*, 116(12):1736-1740.
Lin et al., (1998) "Silicon Nitride Films Deposited by Atmospheric Pressure Chemical Vapor Deposition," *Materials Research Society Symposium Proceedings vol. 495, Chemical Aspects of Electronic Ceramics Processing*, Symposium held Nov. 30-Dec. 4, 1997, Boston, Massachusetts, U.S.A., 8 pages.
Wikipedia, The Free Encyclopedia, Definition of "Silicon Nitride," Archived from Apr. 9, 2015, 1 page [Downloaded on Oct. 12 2017 from https://web.archive.org/web/20150409055521/https://en.wikipedia.org/wiki/Silicon_nitride].

METHODS OF ENCAPSULATION

CROSS-REFERENCE TO RELATED APPLICATION

This application is a continuation of U.S. patent application Ser. No. 15/279,310, filed Sep. 28, 2016, and titled "METHODS OF ENCAPSULATION," which claims benefit of U.S. Provisional Patent Application No. 62/333,054, filed May 6, 2016, and titled "METHODS OF ENCAPSULATION," which is incorporated by reference herein in its entirety and for all purposes.

BACKGROUND

Semiconductor device fabrication involves formation of memory stacks, which are often sensitive to oxidation and moisture and may not withstand high temperature operations or exposure to energetic species. As a result, memory stacks are often encapsulated prior to subsequent processing. However, conventional methods of depositing encapsulation layers may damage components of the process chamber, or may damage substrate materials. Further, conventional techniques may not be capable of forming sufficiently thin and hermetic layers.

SUMMARY

Provided herein are methods and apparatuses for forming an encapsulation layer over a memory device. One aspect involves a method of encapsulating a memory device on a substrate, the method including: (i) exposing the substrate having the memory device to a deposition precursor and a reactant at a substrate temperature less than 300° C.; and (ii) igniting a plasma to deposit an encapsulation layer over the memory device, the encapsulation layer being hermetic and having a hydrogen content less than 15%.

In various embodiments, the method further includes exposing the encapsulation layer to a post-treatment process at a temperature less than 300° C.

For example, in some embodiments, the post-treatment process includes exposing the substrate to a post-treatment gas and igniting a second plasma without a reactant. The substrate may be exposed to the post-treatment gas and the second plasma for a duration between about 10 seconds and about 50 seconds. In some embodiments, the post-treatment gas is any one of nitrogen, ammonia, helium, argon, and combinations thereof. The method may further include repeating (i) and (ii) to form the encapsulation layer.

In another example, in some embodiments, the post-treatment process includes exposing the substrate to ultraviolet radiation. Ultraviolet radiation may be emitted at a wavelength between about 180 nm and about 600 nm for a duration between about 60 seconds and about 600 seconds.

In various embodiments, the encapsulation layer deposited is any one of silicon nitride, undoped silicon carbide, oxygen-doped silicon carbide, germanium nitride, undoped germanium carbide, and oxygen-doped germanium carbide.

In various embodiments, the method includes pulsing the plasma to deposit the encapsulation layer. The pulses of plasma may have a pulse duration between about 0.02 ms and about 5 ms. The plasma may be pulsed at a pulsing frequency between about 100 Hz and about 6 Hz. In some embodiments, the plasma is generated in-situ. In some embodiments, the deposition precursor is a silicon-containing precursor or a germanium-containing precursor.

In various embodiments, the encapsulation layer is deposited by remote plasma enhanced chemical vapor deposition. For example, in some embodiments, the plasma is generated in a region upstream from and separate from a processing region where the substrate is housed. In some embodiments, the remote plasma enhanced chemical vapor deposition includes: (a) flowing the reactant to a remote plasma-generating region and igniting the plasma to generate reactant radicals; (b) introducing the reactant radicals through a showerhead to the substrate; and (c) introducing the deposition precursor downstream of the showerhead to the substrate while introducing the reactant radicals. The substrate may be processed in a chamber having a chamber pressure between about 1.5 Torr and about 7 Torr.

In various embodiments, the memory device is a magnetoresistive random-access memory. In various embodiments, the memory device includes a magnetic tunnel junction.

The encapsulation layer may be deposited to a thickness between about 50 Å and about 500 Å. In some embodiments where a post-treatment process is used, the post-treatment process may be performed after the encapsulation layer is deposited to a thickness between about 20 Å and about 50 Å.

In various embodiments, the encapsulation layer is deposited by plasma enhanced chemical vapor deposition. The encapsulation layer deposited over the memory device may have a step coverage between about 70% and about 90%. In various embodiments, the substrate is patterned with features having an aspect ratio between about 1.5:1 and about 20:1.

The encapsulation layer may be a silicon nitride film deposited by exposing the substrate to a silicon-containing precursor and a nitrogen-containing reactant. In some embodiments, the encapsulation layer is a silicon carbide film deposited by exposing the substrate to a silicon- and carbon-containing precursor and hydrogen.

The method may further include prior to depositing the encapsulation layer, heating the substrate to a temperature of about 300° C.

Another aspect involves a method of encapsulating a memory device on a substrate, the method including (i) exposing the substrate to a deposition precursor and a reactant at a substrate temperature less than about 300° C.; and (b) pulsing a plasma for a duration between about 0.02 ms and about 5 ms at a pulsing frequency between about 100 Hz and about 6 Hz when the substrate is exposed to deposition reactants to form an encapsulation layer, such that the formed encapsulation layer is any one of silicon nitride, undoped silicon carbide, oxygen-doped silicon carbide, germanium nitride, undoped germanium carbide, and oxygen-doped germanium carbide.

The method may further include, after depositing the film, exposing the film to a post-treatment process at a substrate temperature of less than about 300° C. to form the encapsulation layer. The post-treatment process may include exposing the substrate to a post-treatment gas and igniting a plasma without a silicon-containing or germanium-containing reactant. In some embodiments, the post-treatment process includes exposing the substrate to ultraviolet radiation.

Another aspect involves a memory device including: a memory stack; a hermetic encapsulation layer deposited over the memory stack and encapsulating the memory stack, the encapsulation layer deposited at a substrate temperature less than about 300° C. by exposure to a deposition precursor, a reactant, and plasma, the encapsulation layer having a hydrogen content less than 15%. In various embodiments, the encapsulation layer has a step coverage of at least 70%.

In some embodiments, the exposure may include pulsing the plasma using plasma pulse durations between about 0.02 ms and about 5 ms. The encapsulation layer may be post-treated using UV exposure at a substrate temperature less than about 300° C. In some embodiments, the encapsulation layer is post-treated using exposures to a second plasma with post-treatment gas for a duration between about 10 seconds and about 50 seconds.

In some embodiments, the encapsulation layer is any one of silicon nitride (SiN), silicon carbide (SiC), oxygen-doped silicon carbide (SiCO), germanium nitride (GeN), germanium carbide (GeC), and oxygen-doped germanium carbide (GeCO).

The encapsulation layer may be deposited using remote plasma chemical vapor deposition.

Another aspect involves an apparatus for processing a semiconductor substrate comprising a semiconductor material, the apparatus including: one or more process chambers, whereby at least one process chamber comprises a heated pedestal for heating the semiconductor substrate; a plasma generator; one or more gas inlets into the process chambers and associated flow-control hardware; and a controller having at least one processor and a memory, whereby the at least one processor and the memory are communicatively connected with one another, the at least one processor is at least operatively connected with the flow-control hardware, and the memory stores computer-executable instructions for controlling the at least one processor to at least control the flow-control hardware by: (i) setting the pedestal temperature to a temperature less than about 300° C.; (ii) introducing a deposition precursor and a reactant to the one or more process chambers; and (iii) igniting a plasma in pulses when the deposition precursor and reactant are introduced to the one or more process chambers to form a hermetic encapsulation layer having a hydrogen content less than 15%.

The computer-executable instructions may include instructions for pulsing the plasma in (iii) for pulse durations between about 0.02 ms and about 5 ms at a pulsing frequency between about 100 Hz and about 6 Hz. In some embodiments, the memory further stores computer-executable instructions for controlling the at least one processor to at least control the flow-control hardware by: (iv) after igniting the plasma in pulses, stopping flow of the deposition precursor and the reactant to the one or more process chambers; (v) introducing an inert gas to the one or more process chamber; and (vi) igniting a plasma for a duration between about 10 seconds and about 50 seconds.

In some embodiments, the apparatus also includes an ultraviolet radiation source, whereby the memory further stores computer-executable instructions for controlling the at least one processor to at least control the flow-control hardware by turning on the ultraviolet radiation source.

These and other aspects are described further below with reference to the drawings.

DETAILED DESCRIPTION

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

In this application, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry typically has a diameter of 200 mm, or 300 mm, or 450 mm. Unless otherwise stated, the processing details recited herein (e.g., flow rates, power levels, etc.) are relevant for processing 300 mm diameter substrates, or for treating chambers that are configured to process 300 mm diameter substrates, and can be scaled as appropriate for substrates or chambers of other sizes.

Semiconductor manufacturing processes involve the fabrication of memory stacks, which often include materials that are sensitive to oxidation and moisture. Further, memory stacks may also include materials that cannot withstand high temperature operations or exposure to energetic species. As a result, memory stacks are typically encapsulated prior to subsequent processing.

Figure 1:
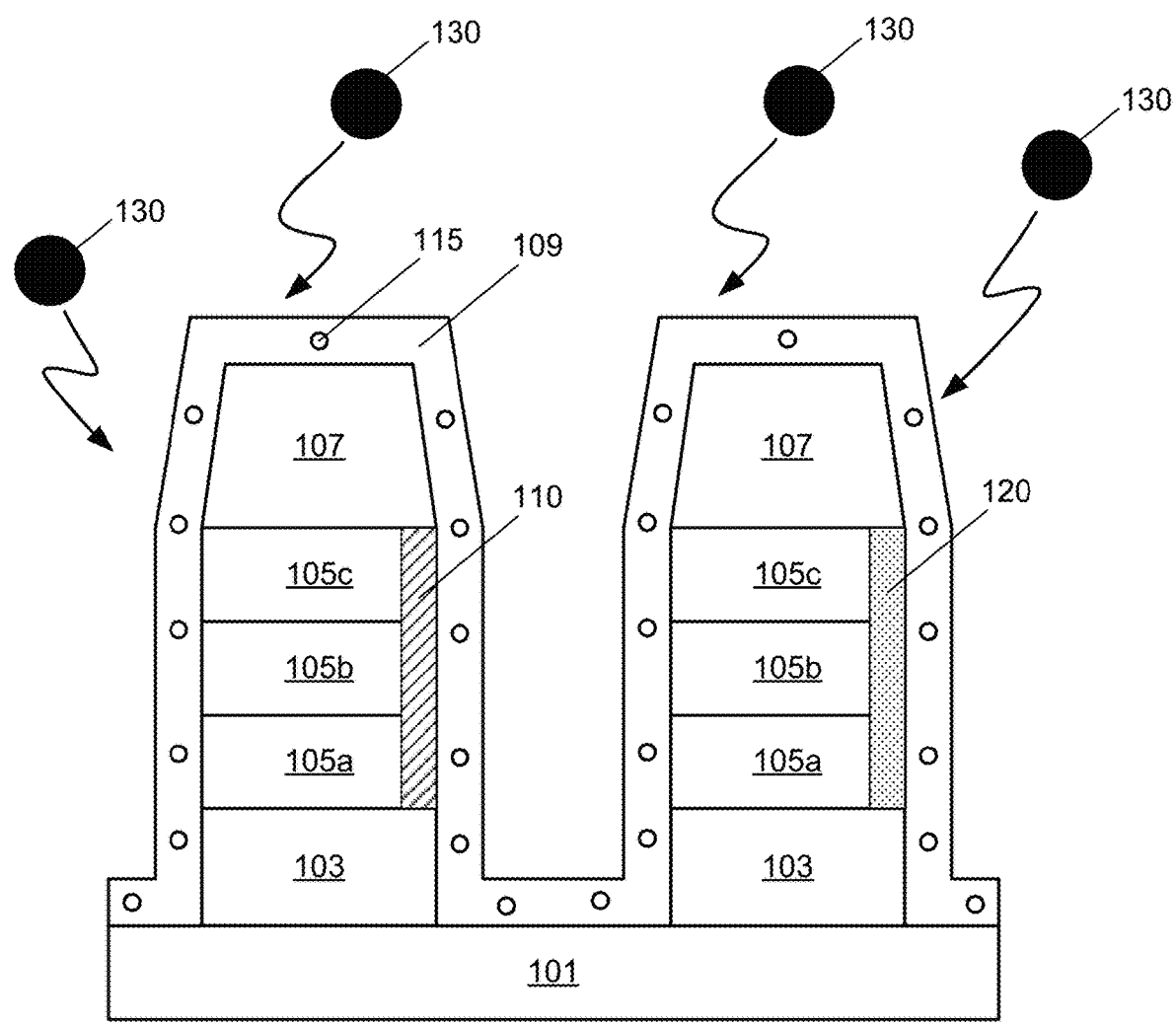
FIG. 1 is a schematic illustration of an example memory stack with encapsulation layer subject to moisture and air exposure.

One example of memory is a magnetic random access memory (MRAM), which includes a plurality of thin metal layers or films may be sequentially etched to form magnetic tunnel junction stacks. A magnetic tunnel junction (MTJ) is composed of a thin dielectric barrier layer between two magnetic materials. Electrons pass through the barrier by the process of quantum tunneling. This can serve as a basis for magnetic-based memory. FIG. 1 provides an example of a substrate 101 with memory stacks having a magnetic tunnel junction including a first magnetic layer 105a, dielectric layer 105b, and a second magnetic layer 105c. Layer 103 is disposed between first magnetic layer 105a and the substrate 101, and layer 107 may be a barrier layer. Various suitable chemistries may be used for each of these layers, and each layer may include more than one layer.

Overlying the two stacks is a conformal encapsulation layer 109. A conventional encapsulation layer 109 may include hydrogen 115, which may diffuse into the magnetic tunnel junction and cause the formation of a nitrogen-containing layer 110. A deficient encapsulation layer 109 may also be susceptible to damage 120, which may form when the material is exposed to moisture such as water molecules 130.

Conventional techniques of depositing encapsulation layers are insufficient to achieve optimal results. For example, encapsulation layers deposited using conventional techniques result in high hydrogen content, which may cause diffusion as described above with respect to FIG. 1; low density and hermeticity, which can result in peeling or removal of the encapsulation layer and insufficient quality to protect the underlying memory; and low step coverage, such as on the order of between about 30% and about 50% for a via having an aspect ratio of 4:1, which can result in partially exposed sidewalls of the memory materials.

The deposited films are also conformal. Conformality of films may be measured by the step coverage. "Step coverage" as used herein is calculated by dividing the average thickness of the deposited film on the sidewall by the average thickness of the deposited film at the top of the feature and multiplying it by 100 to obtain a percentage.

To combat some of these issues, techniques have been developed to achieve low hydrogen content in an encapsulation layer, but such techniques are often performed at high temperatures, which the memory stack is unable to tolerate, thereby resulting in etching of or damage to the memory, such as the dielectric layer in a magnetic tunnel junction, resulting in uneven memory stacks.

Provided herein are methods and apparatuses for depositing encapsulation layers having low hydrogen content, high density and hermeticity, and high step coverage using techniques performed at a low temperature of less than about 300° C. Various disclosed embodiments may be performed at a pressure between about 0.1 Torr and about 20 Torr. In many embodiments, the methods disclosed may be performed at a substrate temperature less than about 300° C., such as about 250° C. or about 200° C., or between about 200° C. and about 250° C. In such embodiments, the pedestal may be set to a temperature of less than about 300° C. to control the substrate temperature. For example, for MRAM and phase change random access memory (PCRAM) applications, the materials on the substrate may be sensitive to high temperatures.

Films may be deposited by plasma enhanced chemical vapor deposition (PECVD) and/or remote plasma enhanced chemical vapor deposition (RPCVD). In various embodiments, films are deposited by exposing a substrate to a deposition precursor and a reactant while pulsing plasma in short pulses, such as pulses having a pulse duration between about 0.01 ms to about 5 ms, or between about 0.02 ms and about 5 ms, or between about 0.05 ms and about 5 ms, or between about 0.05 ms and about 1.9 ms, between about 0.5 ms and about 1.9 ms. Plasma is pulsed in various embodiments using a pulsing frequency between about 100 Hz and about 6 Hz.

Various embodiments involve deposition followed by one or more post-treatment processing operations. Post-treatment processing operations include periodic exposure to inert gas and igniting a plasma during exposure to inert gas. For example, in some embodiments, after an encapsulation layer is deposited, the encapsulation layer may be exposed to an argon plasma for a duration between about 10 seconds and about 50 seconds. In various embodiments, encapsulation layers may be deposited by cycling between (1) PECVD deposition including short pulsed plasma and (2) exposures to inert gas and plasma. Another post-treatment processing operation includes exposing the deposited encapsulation layer to ultraviolet radiation at a substrate temperature less than 300° C.

Films deposited by disclosed embodiments have a hydrogen content that is about 50% to 70% less hydrogen than encapsulation layers deposited by conventional techniques, which typically have a hydrogen content between 25% and 35%. In various embodiments, deposited encapsulation films have a hydrogen content between about 10% and 15% by atomic % using FTIR.

Methods described herein may be used to deposit encapsulation layers of any suitable chemistry, which may include Group IV element nitrides or carbides, any of which may be doped (such as with oxygen) or undoped. In various embodiments, the encapsulation layer may be any of the following chemistries or any of their combinations: silicon nitride (SiN), silicon carbide (SiC), oxygen-doped silicon carbide (SiCO), germanium nitride (GeN), germanium carbide (GeC), and oxygen-doped germanium carbide (GeCO).

Disclosed embodiments may be suitable for depositing encapsulation layers to a thickness between about 50 Å and about 500 Å. For example, an encapsulation layer deposited over an MRAM stack may have a thickness between about 150 Å and about 300 Å. A further example encapsulation layer deposited over a PCRAM stack may be about 50 Å in thickness. Disclosed embodiments may achieve step coverage greater than about 70%, or greater than about 90%, or between about 70% and about 90%.

Figure 2A:
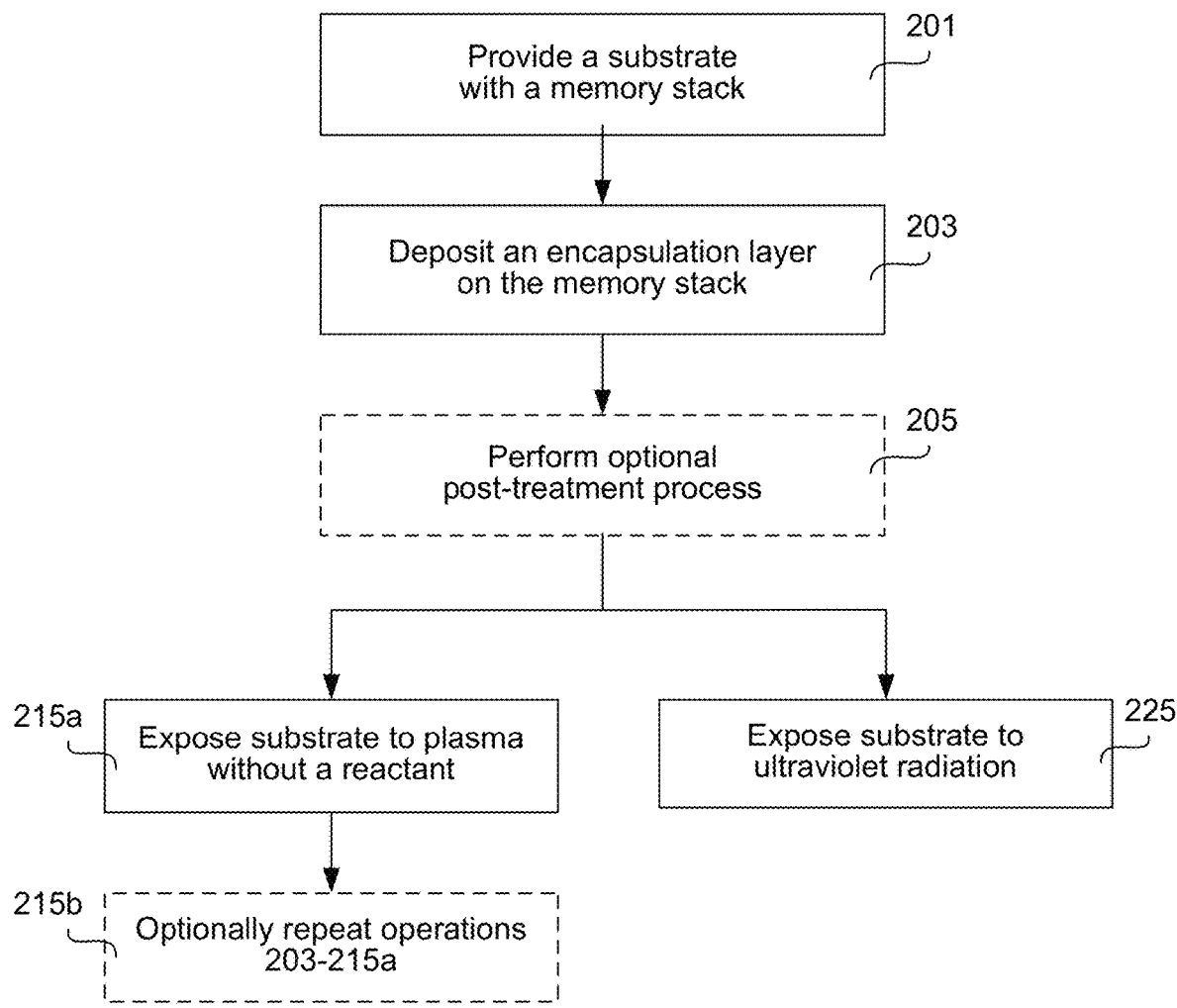
FIGS. 2A-2C are process flow diagrams depicting operations for methods in accordance with disclosed embodiments.

FIG. 2A provides a process flow diagram depicting operations that may be performed in accordance with disclosed embodiments. In operation 201, a substrate including a memory stack is provided. In various embodiments, the substrate is provided to a process chamber. Example process chambers are further described below with respect to FIGS. 4-6.

The substrate may be a silicon wafer, e.g., a 200-mm wafer, a 300-mm wafer, or a 450-mm wafer, including wafers having one or more layers of material, such as dielectric, conducting, or semi-conducting material deposited thereon. Non-limiting examples of under-layers include dielectric layers and conducting layers, e.g., silicon oxides, silicon nitrides, silicon carbides, metal oxides, metal nitrides, metal carbides, and metal layers. In some embodiments, the substrate includes a stack such as a magnetic tunnel junction. In some embodiments, the substrate includes two or more stacks, each of the stacks including layers such as the layers depicted in FIG. 1. The space between stacks may be narrow such that aspect ratios between stacks may be between about 1:1 and about 60:1, or greater than about 1.5:1, or greater than about 4:1, or between about 1.5:1 and 60:1, or between about 1.5:1 and 40:1, or between about 1.5:1 and 20:1, such as about 5:1. In some embodiments, the space between stacks may be referred to as a "feature." A stack may contain non-volatile and ferromagnetic materials such as Co, Fe, Mn, Ni, Pt, Pd, Ru, and combinations thereof (such as CoFe), and may include a dielectric layer such as an MgO layer between two layers of ferromagnetic materials. Some stack materials may include any of the above listed ferromagnetic layers in combination with boron, such as CoFeB.

After operation 201 and prior to operation 203, the substrate may be subject to a "temperature soak" whereby the substrate is heated to the process temperature upon which the substrate will be subject to various operations as described herein. For example, the methods disclosed may be performed at a substrate temperature less than about 300° C., such as about 250° C. or about 200° C., or between about 200° C. and about 250° C. Thus, in some embodiments, the substrate is exposed to a temperature soak such that a pedestal holding the substrate in a process chamber may be set to a temperature of, for example, about 250° C. to heat the substrate to the process temperature and stabilize the temperature prior to processing.

In operation 203, an encapsulation layer is deposited on the memory stack. In various embodiments, the encapsulation layer is deposited on two or more memory stacks. In many embodiments, the encapsulation layer is deposited as a conformal film.

Figure 2B:
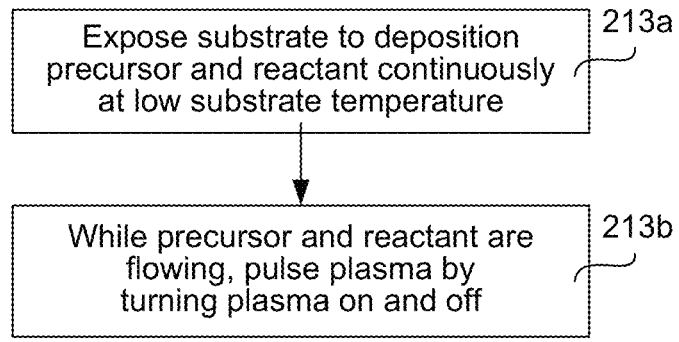
Figure 2C:
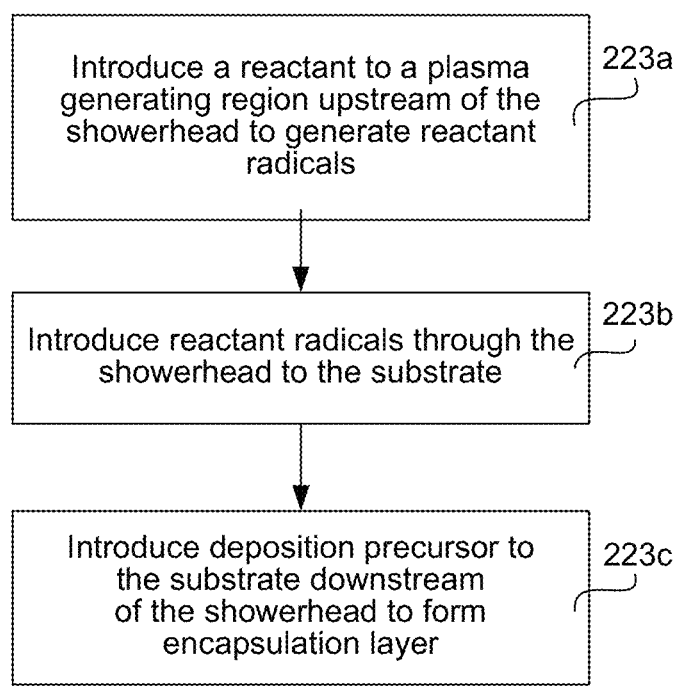

The encapsulation layer may be deposited by various methods. FIGS. 2B and 2C provide process flow diagrams depicting operations of two example methods of depositing an encapsulation layer in accordance with disclosed embodiments.

Operations of FIG. 2B may be used to perform operation 203 of FIG. 2A. In operation 213a of FIG. 2B, the substrate may be exposed to a deposition precursor and a reactant continuously at low substrate temperature. For example, in various embodiments, while the substrate is heated at a temperature of less than about 300° C., continuous flows of a deposition precursor and a reactant may be flowed to a process chamber housing the substrate.

The encapsulation layer may be deposited using a variety of reactants depending on the type of encapsulation layer to be deposited. For example, deposition of a silicon nitride encapsulation layer may be performed by exposing the substrate to a silicon-containing precursor and a nitrogen-containing reactant. In another example, deposition of a silicon carbide precursor may be performed by exposing the substrate to a silicon-containing precursor and a carbon-containing reactant. In another example, deposition of an oxygen-doped silicon carbide precursor may be performed by exposing the substrate to a silicon-containing precursor and an oxygen-and-carbon-containing reactant. In another example, deposition of an oxygen-doped silicon carbide precursor may be performed by exposing the substrate to a silicon-and-carbon-containing precursor and hydrogen. In another example, deposition of a germanium nitride encapsulation layer may be performed by exposing the substrate to a germanium-containing precursor and a nitrogen-containing reactant. In another example, deposition of a germanium carbide precursor may be performed by exposing the substrate to a germanium-containing precursor and a carbon-containing reactant. In another example, deposition of an oxygen-doped germanium carbide precursor may be performed by exposing the substrate to a germanium-containing precursor and an oxygen-and-carbon-containing reactant. In another example, deposition of an oxygen-doped germanium carbide precursor may be performed by exposing the substrate to a germanium-and-carbon-containing precursor and hydrogen.

A general silicon-containing precursor used in methods described herein may have the structure:

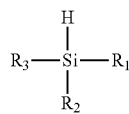

where $R_1$, $R_2$, and $R_3$ may be the same or different substituents, and may include silanes, amines, halides, hydrogen, or organic groups, such as alkylamines, alkoxy, alkyl, alkenyl, alkynyl, and aromatic groups.

Example silicon-containing precursors include polysilanes ($H_3Si$—($SiH_2$)$_n$—$SiH_3$), where n≥1, such as silane, disilane, trisilane, tetrasilane; and trisilylamine:

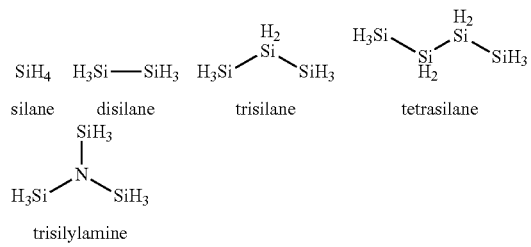

In some embodiments, the silicon-containing precursor is an alkoxysilane. Alkoxysilanes that may be used include, but are not limited to, the following:

$H_x$—Si—$(OR)_y$ where x=1-3, x+y=4 and R is a substituted or unsubstituted alkyl group; and $H_x(RO)_y$—Si—Si—$(OR)_yH_x$ where x=1-2, x+y=3 and R is a substituted or unsubstituted alkyl group.

Examples of silicon-containing precursors include: methylsilane; trimethylsilane (3MS); ethylsilane; butasilanes; pentasilanes; octasilanes; heptasilane; hexasilane; cyclobutasilane; cycloheptasilane; cyclohexasilane; cyclooctasilane; cyclopentasilane; 1,4-dioxa-2,3,5,6-tetrasilacyclohexane; diethoxymethylsilane (DEMS); diethoxysilane (DES); dimethoxymethylsilane; dimethoxysilane (DMOS); methyl-diethoxysilane (MDES); methyl-dimethoxysilane (MDMS); octamethoxydodecasiloxane (OMODDS); tert-butoxydisilane; tetramethylcyclotetrasiloxane (TMCTS); tetraoxymethylcyclotetrasiloxane (TOMCTS); triethoxysilane (TES); triethoxysiloxane (TRIES); and trimethoxysilane (TMS or TriMOS).

In some embodiments, the silicon-containing precursor may be an aminosilane, with hydrogen atoms, such as bisdiethylaminosilane, diisopropylaminosilane, tert-butylamino silane (BTBAS), or tris(dimethylamino)silane. Aminosilane precursors include, but are not limited to, the following: $H_x$—Si—$(NR)_y$ where x=1-3, x+y=4 and R is an organic or hydride group.

In some embodiments, a halogen-containing silane may be used such that the silane includes at least one hydrogen atom. Such a silane may have a chemical formula of $SiX_aH_y$, where y≥1. For example, dichlorosilane ($H_2SiCl_2$) may be used in some embodiments.

Example nitrogen-containing reactants include nitrogen gas and ammonia gas.

Example germanium-containing reactants include any germanium-containing compound that can react to form a germanium nitride, germanium carbide, or oxygen-doped germanium carbide. Examples include germanes, such as $Ge_nH_{n+4}$, $Ge_nH_{n+6}$, $Ge_nH_{n+8}$, and $Ge_nH_m$, where n is an integer from 1 to 10, and n is a different integer than m. Other germanium-containing compounds may also be used, e.g., alkyl germanes, alkyl germanium, aminogermanes, carbogermanes, and halogermanes.

Example carbon-containing reactants include tetramethylsilane, trimethylsilane, and bis tributylaminosilane. In some embodiments, silicon carbide or germanium carbide encapsulation layers may be deposited by reacting a silicon and carbon-containing precursor with hydrogen.

An oxygen-doped carbide may be deposited by using a co-reactant other than or in addition to one or more silicon-containing precursors. Examples of such co-reactants include carbon dioxide ($CO_2$), carbon monoxide (CO), water ($H_2O$), methanol ($CH_3OH$), oxygen ($O_2$), ozone ($O_3$), nitrogen ($N_2$), nitrous oxide ($N_2O$), ammonia ($NH_3$), methane ($CH_4$), ethane ($C_2H_6$), acetylene ($C_2H_2$), ethylene ($C_2H_4$), diborane, and combinations thereof.

In some embodiments, oxygen and/or carbon dioxide is introduced with the precursor to alter the composition of the silicon carbide film by removing carbon from the film or precursor during deposition. In some embodiments, an oxygen-and-carbon-containing reactant such as methanol may be used.

In various embodiments, to deposit an oxygen-doped silicon carbide encapsulation layer, or an oxygen-doped germanium carbide encapsulation layer, hydrogen gas may be used as a reactant.

In operation 213b, while the precursor and reactant are continuously flowing, an in-situ plasma may be ignited and pulsed by turning the plasma on and off. The plasma may be ignited at a plasma frequency of 13.56 MHz. In some embodiments, the plasma is generated using a dual frequency radio frequency generator. In some embodiments, the plasma is generated using a single frequency radio frequency generator. In various embodiments, the plasma power for a high frequency plasma is between about 400 W (0.1 $W/cm^2$) and about 5000 W (1.5 $W/cm^2$). In various embodiments, the plasma power for a low-frequency plasma is between about 400 W (0.1 $W/cm^2$) and about 3000 W (1 $W/cm^2$). The plasma may be pulsed at a pulse frequency between about 2 Hz and about 100 kHz with duty cycle ranging from about 1% to about 95%. The duty cycle is defined as the duration for which the plasma is on during a period having a duration T. The duration T includes the duration for pulse ON time (the duration for which the plasma is in an ON state) and the duration for plasma OFF time (the duration from which the plasma is in an OFF state) during a given period. The pulse frequency will be understood as 1/T. For example, for a plasma pulsing period T=100 μs, frequency is 1/T=1/100 μs, or 10 kHz. The duty cycle or duty ratio is the fraction or percentage in a period T during which the plasma is in the ON state such that duty cycle or duty ratio is pulse ON time divided by T. For example, for a plasma pulsing period T=100 μs, if a pulse ON time is 70 μs (such that the duration for which the plasma is in an ON state in a period is 70 μs) and a pulse OFF time is 30 μs (such that the duration for which the plasma is in an OFF state in a period is 30 μs), the duty cycle is 70%. In some embodiments, the shortest RF on time during the pulse step can be as low as about 5 μsec. In some embodiments, the shortest RF off time can be about 5 μsec. Depending on the duty cycle and the frequency, various combinations of RF on/RF off pulses can be performed. For example, in some embodiments, this operation may be performed for a duration of about 0.01 ms to about 5 ms, or between about 0.02 ms and about 5 ms, or between about 0.05 ms and about 5 ms, or between about 0.05 ms and about 1.9 ms, between about 0.5 ms and about 1.9 ms. During operation 213b, the plasma may be pulsed hundreds to thousands of time depending on total plasma duration time.

Without being bound by any particular theory, it is believed that pulsing plasma achieves conditions sufficient to form a conformal encapsulation layer over a substrate with high step coverage. In continuous PECVD plasma deposition, when the plasma is on, ions, radicals, neutral species, and other reactive species are generated in the chamber. The presence of ions results in directionality, such that films deposited on sidewalls of a feature may not be deposited uniformly and may not achieve high step coverage.

In pulsed PECVD deposition as described herein, it is believed that when the plasma is turned off after each pulse, reactive species recombine in the following order: electrons disappear/recombine, ions recombine, and radicals recombine. Since the pulses are extremely short (e.g., plasma is turned on for a short duration, then turned off for a longer duration to allow deposition), when the plasma is turned off, the electrons and ions recombine, eliminating the directionality of the ions in depositing the material. Radicals take a longer time to recombine, so deposition is mainly driven by radicals, rather than ions. Radicals are then able to delve deep into high aspect ratio features (1.5:1-20:1, particularly suitable for applications greater than 4:1) and deposit a conformal, high step coverage film even at the bottom of the features.

FIG. 2C provides a second example method of depositing an encapsulation layer in accordance with disclosed embodiments. Operations in FIG. 2C may be used to perform operation 203 of FIG. 2A. FIG. 2C may be performed in any suitable apparatus for remote plasma chemical vapor deposition (RPCVD). One example apparatus is provided in FIG. 6 and described in further detail below.

In operation 223a of FIG. 2C, a reactant is introduced to a plasma-generating region upstream of a showerhead of a process chamber housing the substrate. The reactant is introduced to this region to generate reactant radicals. It will be understood that although the process conditions of operation 223a may be toggled to generate mostly reactant radicals, some ions, electrons, and other species may be generated in the plasma. For example, in some embodiments, nitrogen or a mixture of nitrogen and hydrogen gas may be delivered to the plasma-generating region and ignited to form a plasma containing mostly reactant radicals.

In various embodiments, the reactant may be any of the nitrogen-containing reactants, carbon-containing reactants, oxygen-and-carbon-containing reactants, hydrogen, or combinations thereof as described above with respect to operation 213a of FIG. 2B, except for ammonia ($NH_3$) gas, as ammonia gas may be less susceptible to forming reactant radicals in a remote plasma. Note that for depositing a silicon-containing film or a germanium-containing film, the silicon- or germanium-containing precursor may not be the reactant that is delivered to the plasma-generating region in this operation.

Note that in some embodiments, the plasma-generating region may be in a remote plasma generator. For example, in some embodiments, a capacitively-coupled plasma generator may be used. The plasma is generated by applying a plasma power between about 0 W and about 500 W at a frequency of 13.56 MHz to the plasma-generating region. The plasma may be generated using a power density between about 0.1 $W/cm^2$ and about 1.5 $W/cm^2$.

In operation 223b, the reactant radicals generated from the plasma-generating region are delivered to the process chamber housing the substrate through the showerhead.

In operation 223c, a deposition precursor is introduced to the substrate downstream of the showerhead to react with the reactant radicals and form an encapsulation layer over the substrate. In some embodiments, the deposition precursor is introduced downstream of the plasma-generating region. The deposition precursor may be flowed or injected into the process chamber. In various embodiments, the deposition precursor is delivered via an inlet separate from the showerhead to the process chamber. The deposition precursor may be any Group IV-containing precursor, such as a silicon-containing precursor or germanium-containing precursor as described above with respect to operation 213a of FIG. 2B.

It is believed that reactant radicals delivered from the plasma-generating region may react with the deposition precursor to form complex radicals, which deposits onto the substrate surface as an encapsulation layer. It is further believed that since the plasma species delivered to the chamber includes primarily reactant radicals, as opposed to ions, there is little to no ion-induced damage due to ion bombardment on the surface of the substrate. The pressure of the process chamber during deposition may be between about 1.5 Torr and about 7 Torr. In some embodiments, the process chamber may have a pressure greater than about 7 Torr to deposit a more conformal film.

Operations 223a-223c may be performed while the substrate in the process chamber is heated to a temperature less than about 300° C. For example, the encapsulation layer formed in operation 223c may be formed over a substrate on a pedestal in the process chamber where the temperature of the pedestal is set to a temperature less than about 300° C., such as about 250° C.

Films deposited using the method of encapsulation described with respect to FIG. 2C may have a high step coverage. For example, for a substrate having features with an aspect ratio of 8:1, an oxygen-doped silicon carbide encapsulation layer deposited in accordance with a method such as described with respect to operations 223a-223c may have a step coverage greater than about 90%. Such films may also have reduced hydrogen content, which may be due to the mechanism in which the film is deposited. In various embodiments, such films may have higher quality such that the films are thin, yet hermetic. These films exhibit the same film quality on sidewalls, such as on regions abutting a magnetic tunnel junction, as on field regions of the substrate.

Returning to FIG. 2A, in operation 205, an optional post-treatment is performed. In some embodiments, post-treatment methods described herein may be used with conventional PECVD of encapsulation layers to reduce hydrogen content and improve the quality of the deposited layers. However, encapsulation layers deposited using conventional PECVD and post-treated using disclosed embodiments may not yield as high quality films with high step coverage as encapsulation layers deposited using disclosed embodiments (such as described above with respect to FIGS. 2B and 2C) and post-treatment embodiments described herein.

In some embodiments, post-treatment may be optional such that encapsulation layers are deposited using a method such as described with respect to FIG. 2B or 2C. Encapsulation layers deposited using a combination of a deposition method as described herein and a post-treatment method as described in further detail below may exhibit higher quality, higher step coverage films than films deposited without post-treatment. Examples are described in further detail herein.

Operation 205 may be performed by performing a periodic plasma treatment, an example of which is depicted in operations 215a and 215b of FIG. 2A. Alternatively, operation 205 may be performed by performing an ultraviolet (UV) exposure post-treatment process, which is depicted in operation 225 in FIG. 2A. In some embodiments, the substrate may be subject to one or a combination of both post-treatments. For example, in some embodiments, after depositing an encapsulation layer, the substrate may be exposed to periodic plasma treatment. In some embodiments, operations may be repeated for a substrate including a first encapsulation layer that is exposed to a periodic plasma treatment such that after the periodic plasma treatment, a second encapsulation layer may be deposited over the treated first encapsulation layer. In some embodiments, after depositing an encapsulation layer, the substrate may be exposed to UV for UV post-treatment. In some embodiments, after depositing the encapsulation layer, the substrate may be exposed to a periodic plasma treatment, and then a UV post-treatment.

In operation 215a, the substrate including the deposited encapsulation layer is exposed to a plasma without a silicon-containing or germanium-containing reactant at a substrate temperature less than about 300° C. to treat the deposited encapsulation layer as one method of performing a post-treatment process In some embodiments where a post-treatment process is used, the post-treatment process may be performed after the encapsulation layer is deposited to a thickness between about 20 Å and about 50 Å. In some embodiments, pulsed plasma deposition as described above with respect to FIG. 2B is performed in combination with operation 215a such that operation 215a is performed periodically. For example, in some embodiments, after operation 203 in FIG. 2A whereby operations 213a and 213b of FIG. 2B are performed, flows of a silicon-containing precursor and a reactant are stopped, a post-treatment gas is introduced, and a continuous plasma is ignited to treat the deposited film without a silicon-containing or germanium-containing reactant. Performing a combination of pulsed PECVD and post-treatment plasma exposure to a post-treatment plasma achieves higher quality, higher step coverage, and lower hydrogen content silicon-containing films than performing pulsed PECVD alone. Although conventionally deposited PECVD films deposited using continuous plasma may be used in combination with post-treatment, such films may not yield as high a quality of films with high step coverage as films deposited using a combination of pulsed PECVD and post-treatment. In various embodiments, where the encapsulation layer is deposited by a pulsed PECVD process as described above with respect to FIG. 2B, plasma exposure during operation 215a may be longer than each plasma pulse of operation 213b of FIG. 2B. For example, in various embodiments, plasma exposure during operation 215b may have a duration between about 10 seconds and about 50 seconds while each plasma pulse used to deposit the encapsulation layer in operation 203 such as during pulses of operation 213b may have a duration as short as hundredths of a millisecond to microseconds. Example pulse durations for plasma pulsing in operation 213b are described above with respect to FIG. 2B.

Further, unlike operation 213b, during operation 215a, no silicon-containing or germanium-containing reactants are flowed to the process chamber. Rather, a post-treatment gas such as an inert gas is flowed to the process chamber during operation 215 when the plasma is ignited, thereby generating a plasma species that may be capable of modifying and densifying the deposited encapsulation layer. Inert gases may be selected depending on the type of film to be deposited and the reactants used during the encapsulation layer deposition process. A general list of possible inert gases includes nitrogen, ammonia, and noble gases such as helium and argon. Gases may be selected depending on the type of film to be deposited and the reactants used during the deposition process. The post-treatment gas may include nitrogen only, ammonia only, nitrogen/ammonia mixture, argon only, helium only, argon/helium mixture, and combinations thereof. Other noble gases may also be used. In some embodiments, even if nitrogen is used in operation 205 to form silicon nitride, operation 207 may involve exposure to nitrogen plasma during post-treatment to reduce hydrogen content and densify the film. It is believed that periodic exposure to longer durations of plasma with inert gas reduces hydrogen content of the deposited encapsulation layer. The upper region of the encapsulation layer may have reduced hydrogen content. For example, in some embodiments, the top about 25 Å to about 30 Å of the encapsulation layer may have reduced hydrogen content.

In operation 215b, operations 203-215a may be optionally repeated such that an encapsulation layer is deposited in various cycles, each cycle including deposition and post-treatment. Repeated cycles may be performed to improve the quality of the deposited encapsulation layer.

In operation 225, the substrate may be exposed to UV radiation at a substrate temperature less than about 300° C. For operation 225, the substrate may be transferred from a deposition process chamber to a UV radiation process chamber. An example apparatus is described below with respect to FIG. 5. UV radiation may be emitted at a wavelength between about 180 nm and about 600 nm for a duration between about 60 seconds and about 600 seconds.

In some embodiments, operation 225 may be performed at a temperature that is greater than the substrate temperature used during encapsulation layer deposition. In some embodiments, if a conventional PECVD encapsulation layer is deposited at a temperature greater than 300° C., the encapsulation layer may have less hydrogen content than an encapsulation layer deposited at a temperature less than 300° C., but an encapsulation layer deposited at a temperature greater than 300° C. may be less susceptible to modification by UV treatment and thus UV treatment may not help reduce the overall hydrogen content of such an encapsulation layer. Thus, UV treatment is suited for embodiments where the encapsulation layer is deposited at a temperature less than about 300° C.

In some embodiments, the substrate temperature during deposition may be different from the substrate temperature during UV treatment. In some embodiments, where periodic plasma treatment is also used between deposition and UV treatment, the substrate temperature during the periodic plasma treatment may be the same as or different from the substrate temperature during deposition. In various embodiments, although the substrate temperatures are different, the substrate temperatures during each operation may be less than about 300° C. The temperatures selected for both the deposition and the UV treatment may depend on the encapsulation layer material being deposited. For example, a germanium-containing encapsulation layer includes germanium-hydrogen bonds, which have lower energy than silicon-hydrogen bonds. Thus, for deposition and treatment of a germanium-containing encapsulation layer, the deposition may be performed at a higher temperature (such as at about 300° C.) and be treated with UV radiation at the same, higher temperature because the germanium-containing encapsulation layer, although the layer is deposited at a higher temperature to result in a layer having less hydrogen content than a layer deposited at a lower temperature, the bond energy between germanium and hydrogen is less than the bond energy between silicon and hydrogen, and thus UV radiation is capable of modifying the germanium-hydrogen bonds of a film deposited at a higher temperature while UV radiation may not be capable of modifying silicon-hydrogen bonds of a film deposited at the same temperature. Thus, in some embodiments, for depositing a silicon-containing encapsulation layer, the silicon-containing encapsulation layer may be deposited at a lower deposition temperature (such as a temperature less than about 250° C.) and then subjected to UV radiation at a temperature such as about 300° C.

In one example, an encapsulation layer may be deposited by the method described above with respect to FIG. 2B, then may be subjected to UV treatment at a temperature less than about 300° C., such as at about 300° C., or about 250° C. In another example, an encapsulation layer may be deposited by the method described above with respect to FIG. 2C, then may be subjected to UV treatment at a temperature less than about 300° C. In another example, an encapsulation layer may be deposited by the method described above with respect to FIG. 2B, then may be subjected to post-treatment as described with respect to operations 215a and 215b, and then may be subjected to UV treatment at a temperature less than about 300° C. In another example, an encapsulation layer may be deposited by the method described above with respect to FIG. 2C, then may be subjected to post-treatment as described with respect to operations 215a and 215b, then may be subjected to UV treatment at a temperature less than about 300° C.

Figure 3:
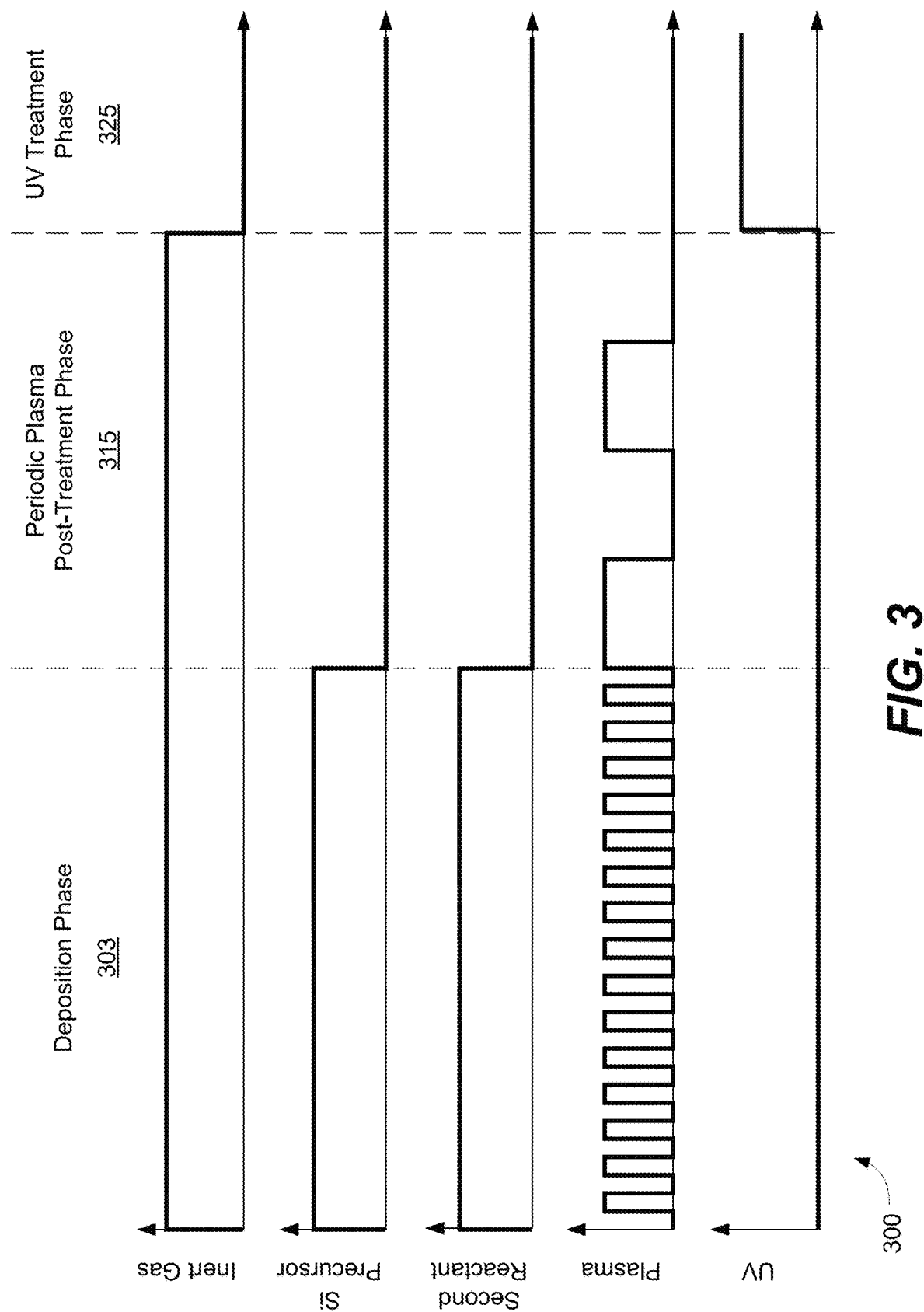
FIG. 3 is a timing sequence diagram showing an example of a method in accordance with certain disclosed embodiments.

FIG. 3 is an example timing sequence diagram showing an example of a method in accordance with certain disclosed embodiments. Process 300 includes a deposition phase 303, a periodic plasma post-treatment phase 315, and a UV treatment phase 325. Deposition phase 303 may correspond to operation 203 of FIG. 2A. In this example process 300, deposition phase 303 includes deposition of an encapsulation layer using pulsed PECVD as described above with respect to FIG. 2B. This example process 300 is provided as depositing a silicon-containing encapsulation layer. As shown, inert gas may be flowed during the deposition phase 303. The silicon-containing precursor is also constantly flowed during deposition phase 303, and the second reactant, which may be any of the reactants described above with respect to operation 213a of FIG. 2B, may also be constantly flowed during deposition phase 303. The plasma may be pulsed as shown in deposition phase 303 such that the plasma is turned on and turned off in short pulses. During this phase, no UV exposure is used.

In periodic plasma post-treatment phase 315, the inert gas may continue to flow. Note that although the inert gas used in process 300 is used for the post-treatment as a post-treatment gas for igniting the plasma, in some embodiments the periodic plasma post-treatment may be performed using a post-treatment gas that is not an inert gas and/or is not the carrier gas used for delivering process gases. For example, any suitable post-treatment gas as described above with respect to FIG. 2A may be used to generate the plasma for post-treatment. Periodic plasma post-treatment phase 315 may correspond to operations 215a and 215b of FIG. 2A. During this phase, the silicon-containing precursor flow and the second reactant flow are turned off to prevent deposition of any material onto the substrate. The plasma is turned on and turned off for two cycles as shown in FIG. 3 as an example. Note that the plasma on duration during each exposure of the periodic plasma post-treatment phase is longer than the short pulses used during deposition. Note that although two cycles are depicted here, in some embodiments, periodic plasma post-treatment may be performed for one cycle, or may be performed for two or more cycles. Although UV treatment phase 325 immediately follows periodic plasma post-treatment phase 315 in this example, in some embodiments another deposition phase may be performed after periodic plasma post-treatment phase 315. During periodic plasma post-treatment phase 315, there is no UV exposure.

In UV treatment phase 325, the inert gas may be turned off, and all reactant flows including the silicon-containing precursor and second reactant flows, are turned off. Here, no plasma is ignited, and only UV radiation is turned on to modify, densify, and/or cure the deposited encapsulation layer. UV treatment phase 325 may correspond to operation 225 of FIG. 2A.

Apparatus

Deposition techniques provided herein may be implemented in a plasma enhanced chemical vapor deposition (PECVD) chamber or a conformal film deposition (CFD) chamber or in some embodiments, an atomic layer deposition (ALD) chamber. Such a chamber may take many forms, and may be part of an apparatus that includes one or more chambers or reactors (sometimes including multiple stations) such as described in further detail with respect to FIG. 7 that may each house one or more substrate or wafer and may be configured to perform various substrate processing operations. The one or more chambers may maintain the substrate in a defined position or positions (with or without motion within that position, e.g., rotation, vibration, or other agitation). In one implementation, a substrate undergoing film deposition may be transferred from one station to another within a chamber (or from one chamber to another within an apparatus) during the process. In other implementations, the substrate may be transferred from chamber to chamber within the apparatus to perform different operations, such as UV exposure operations, etching operations, or lithography operations. The full film deposition may occur entirely at a single station or any fraction of the total film thickness for any deposition step. While in process, each substrate may be held in place by a pedestal, substrate chuck, and/or other substrate-holding apparatus. For certain operations in which the substrate is to be heated, the apparatus may include a heater, such as a heating plate.

Figure 4:
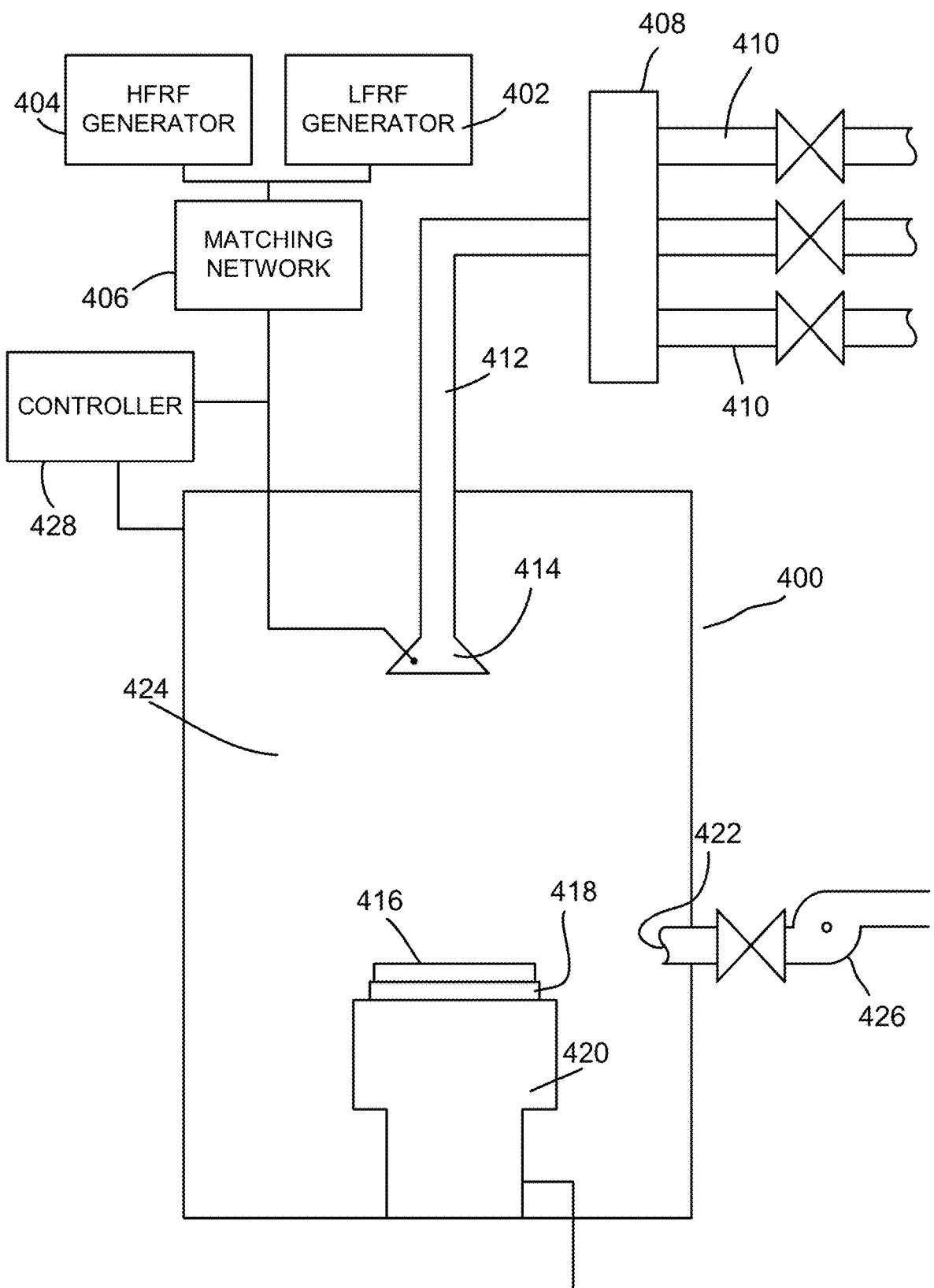
FIGS. 4-6 are schematic diagrams of example process chambers for performing disclosed embodiments.

FIG. 4 provides a simple block diagram depicting various reactor components arranged for implementing methods described herein. Reactor 400 may be used to deposit encapsulation layers as described herein. As shown, a reactor 400 includes a process chamber 424 that encloses other components of the reactor and serves to contain a plasma generated by a capacitive-discharge type system including a showerhead 414 working in conjunction with a grounded heater block 420. A high frequency (HF) radio frequency (RF) generator 404 and a low frequency (LF) RF generator 402 may be connected to a matching network 406 and to the showerhead 414. The power and frequency supplied by matching network 406 may be sufficient to generate a plasma from process gases supplied to the process chamber 424. For example, the matching network 406 may provide 100 W to 1000 W of power. The HFRF component may generally be between 1 MHz to 100 MHz, e.g., 13.56 MHz. In operations where there is an LF component, the LF component may be from less than about 1 MHz, e.g., 100 kHz. In some embodiments, the plasma may be pulsed for a pulse frequency between about 300 Hz and about 1.5 kHz, such as about 500 Hz for a duty cycle. Controller 428 may be configured to set the duration of each plasma pulse to a duration of about 0.05 ms to about 5 ms, such as between about 0.02 ms and about 1.9 ms. In some embodiments, the plasma may be turned on for periodic plasma treatment as a post-treatment as described herein. For periodic plasma treatment, the plasma may be turned on for a duration between about 10 seconds and about 50 seconds.

Within the reactor 400, a pedestal 418 may support a substrate 416. The pedestal 418 may include a chuck, a fork, or lift pins (not shown) to hold and transfer the substrate 416 during and between the deposition and/or post-treatment operations. The chuck may be an electrostatic chuck, a mechanical chuck, or various other types of chuck as are available for use in the industry and/or for research.

Various process gases may be introduced via inlet 412. For example, gases may include a Group IV-containing precursor such as a silicon-containing precursor or a germanium-containing precursor. Gases may include a second reactant, such as hydrogen, a carbon-containing reactant, an oxygen-containing reactant, an oxygen-and-carbon-containing reactant, a nitrogen-containing reactant (such as nitrogen or ammonia), and combinations thereof. In some embodiments, inert gases or carrier gases may also be flowed. Example inert gases include argon, helium, and in some cases, nitrogen. In some embodiments, carrier gases are diverted prior to delivering process gases to the process chamber 424.

Multiple source gas lines 410 are connected to manifold 408. The gases may be premixed or not. Appropriate valving and mass flow control mechanisms may be employed to ensure that the correct process gases are delivered during the deposition and post-treatment phases of the process. In the case where a chemical precursor(s) is delivered in liquid form, liquid flow control mechanisms may be employed. Such liquids may then be vaporized and mixed with process gases during transportation in a manifold heated above the vaporization point of the chemical precursor supplied in liquid form before reaching the process chamber 424.

Process gases, such as a silicon-containing precursor or nitrogen-containing gas, may exit process chamber 424 via an outlet 422. A vacuum pump 426, e.g., a one or two stage mechanical dry pump and/or turbomolecular pump, may be used to draw process gases out of the process chamber 424 and to maintain a suitably low pressure within the process chamber 424 by using a closed-loop-controlled flow restriction device, such as a throttle valve or a pendulum valve.

Apparatus 400 includes a controller 428 which may include one or more memory devices, one or more mass storage devices, and one or more processors. The processor may include a CPU or computer, analog and/or digital input/output connections, stepper motor controller boards, etc. The apparatus 400 includes system controller 428 employed to control process conditions and hardware states of process tool 400. The controller 428 may be configured to deliver certain process gases at various flow rates for certain durations and control plasma frequency, plasma pulse frequency, plasma power, and other process conditions as described herein. The controller 428 may be configured to turn the plasma on and off in accordance with some embodiments. The controller 428 may have any of the characteristics of controller 750 described below with respect to FIG. 7.

Figure 5:
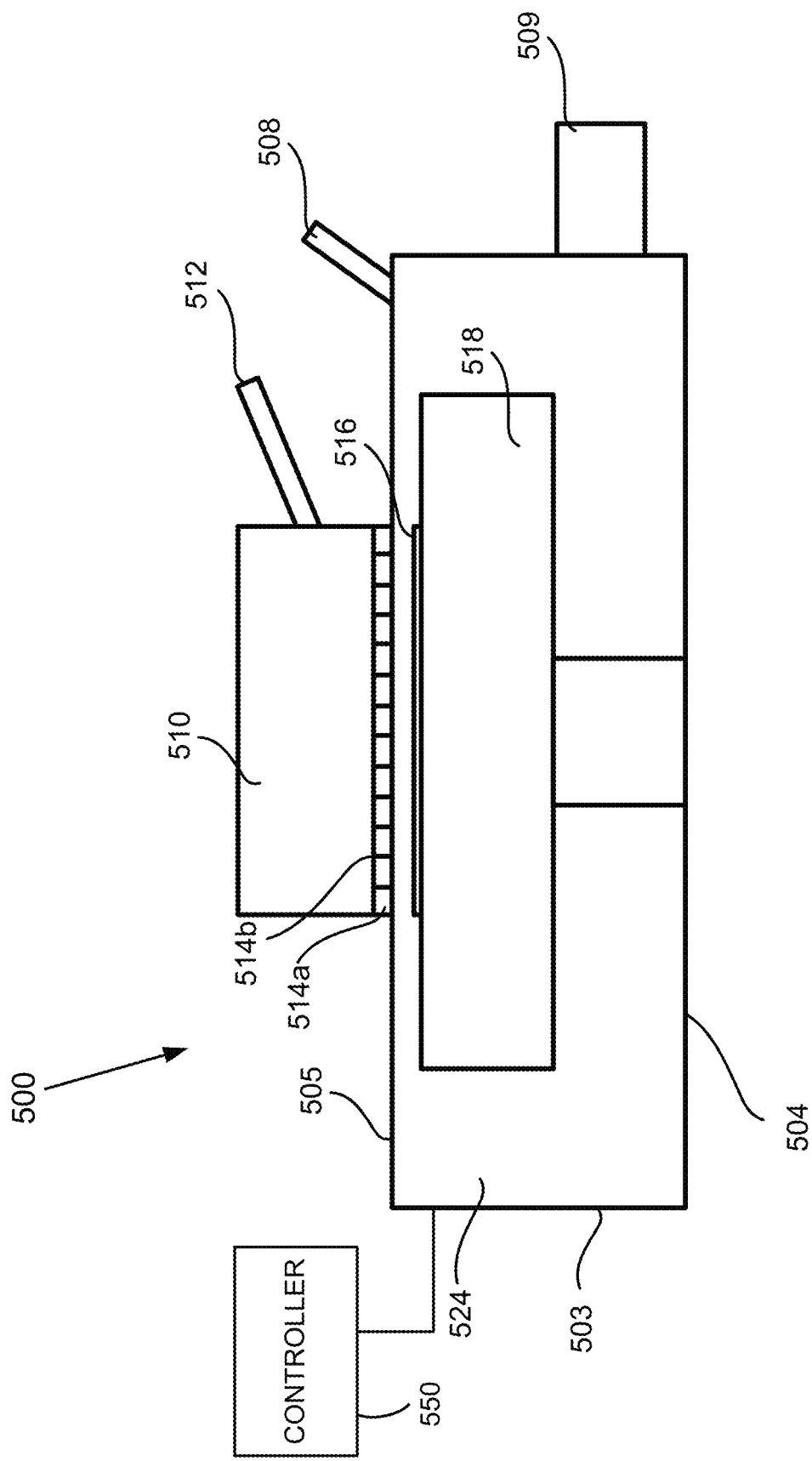

In some embodiments, an encapsulation layer may be deposited in a remote plasma chemical vapor deposition (RPCVD) chamber. FIG. 5 presents a simplified view of an apparatus 500 that may be used for certain radical-based processes such as a radical-based encapsulation layer deposition process. Other radical-based processes and reaction chambers may also be used in accordance with certain embodiments. Apparatus 500 includes a processing chamber 524 which includes chamber walls 503, chamber floor 504, and chamber ceiling 505. Inside the processing chamber 524 is a substrate support 518, on which substrate 516 sits. The processing chamber 524 also includes an inlet 508 and an exhaust outlet 509. A remote plasma source 510 is provided above the processing chamber 524. The remote plasma source 510 includes a plasma generator (not shown) for generating a plasma within the remote plasma source. The plasma generator includes hardware (e.g., coils, electrodes, etc.) for producing a plasma, which may be an inductively coupled plasma, a capacitively coupled plasma, a microwave coupled plasma, etc. The remote plasma source 510 is separated from the processing chamber 524 by a showerhead 514a having a plurality of showerhead holes 514b. The remote plasma source 510 has an inlet 512 for providing gas used to generate the remote plasma. The apparatus 500 includes system controller 550 employed to control process conditions and hardware states of process tool 500. The controller 550 may have any of the characteristics of controller 750 described below with respect to FIG. 7.

Figure 6:
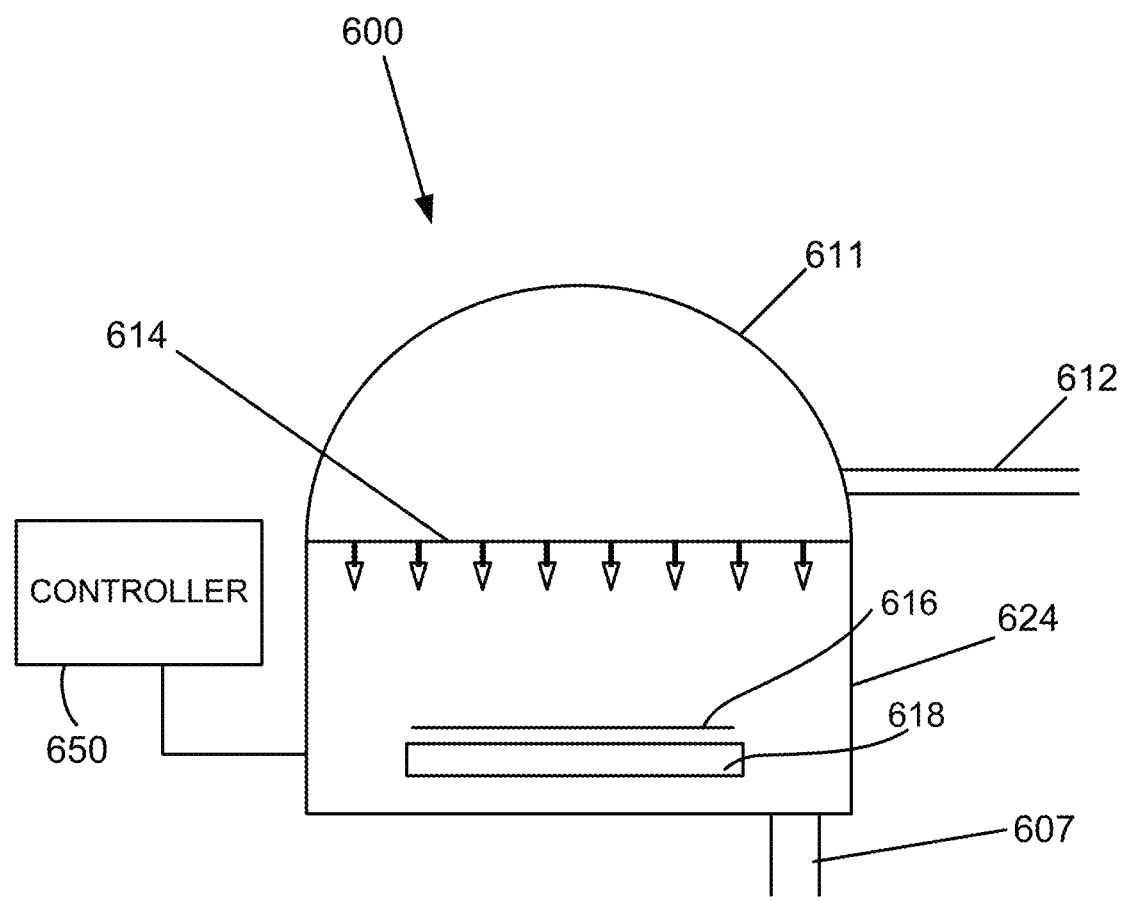

In various embodiments, a deposited encapsulation layer may be subject to ultraviolet (UV) post-treatment as described in disclosed embodiments, for example with respect to operation 225 of FIG. 2A as described above. In some embodiments, the substrate including the deposited encapsulation layer may be transferred to a chamber for curing or exposing the substrate to UV radiation. FIG. 6 shows a schematic illustration of an example of an exposure chamber 624 for exposing a substrate 616 to UV. For example, the apparatus 600 shown in FIG. 6 may be used to perform operation 225 as described above with respect to FIG. 2A. Apparatus 600 has a plasma producing portion 611 and an exposure chamber 624 separated by a showerhead assembly or faceplate 614. Inside exposure chamber 624, a platen (or stage) 618 provides a wafer support. Platen 618 is fitted with a heating/cooling element. In some embodiments, platen 618 is also configured for applying a bias to substrate 616. Low pressure is attained in exposure chamber 624 via vacuum pump via conduit 607. Sources of gaseous treatment gases provide a flow of gas via inlet 612 into plasma producing portion 611 of the apparatus 600. Plasma producing portion 611 may surrounded by induction coils (not shown). During operation, gas mixtures are introduced into plasma producing portion 611, the induction coils are energized and a plasma is generated in plasma producing portion 611. Showerhead assembly 614 may have an applied voltage and terminates the flow of some ions and allows the flow of neutral species into exposure chamber 624. The apparatus 600 includes system controller 650 employed to control process conditions and hardware states of apparatus 600. The controller 650 may have any of the characteristics of controller 750 described below with respect to FIG. 7.

Figure 7:
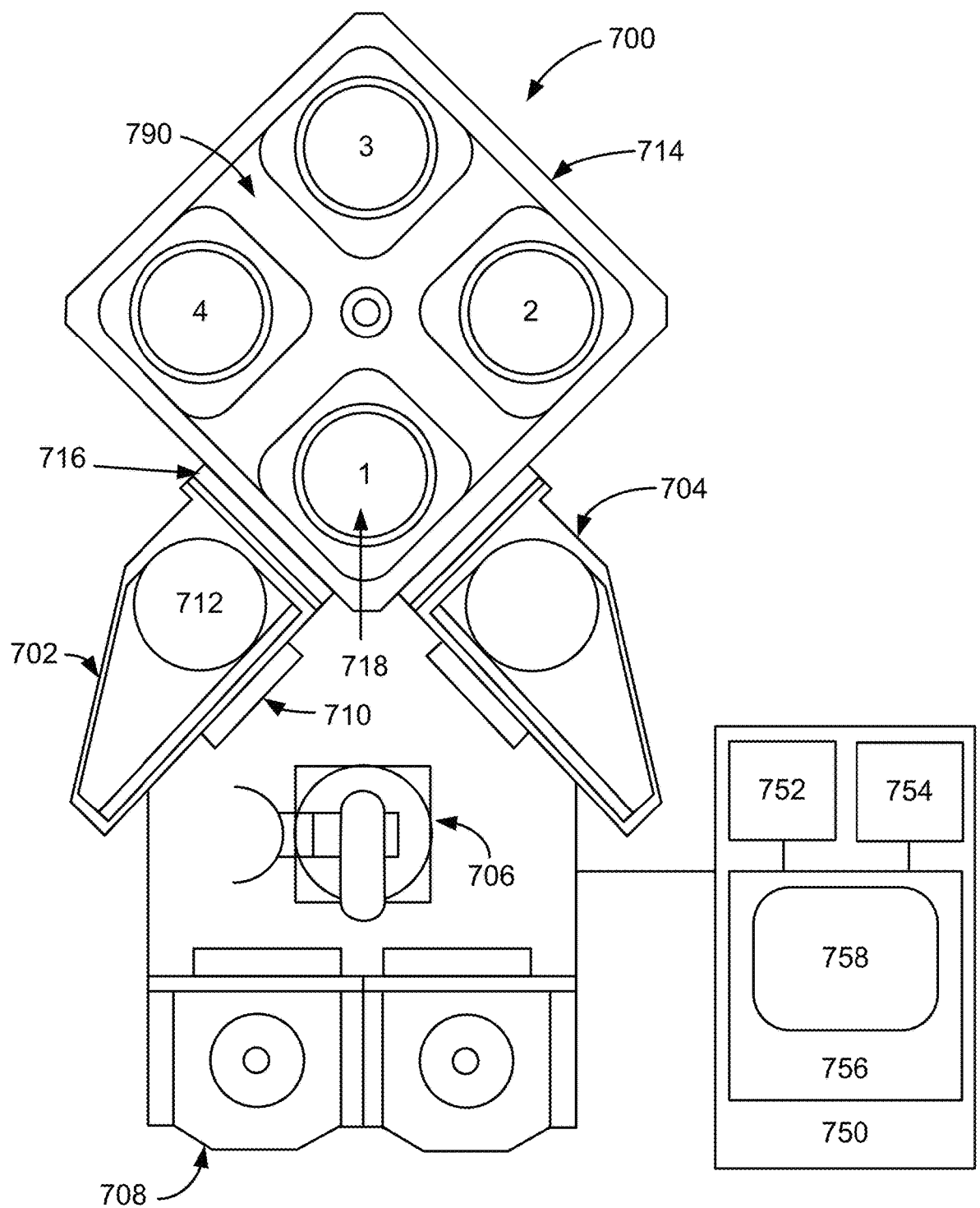
FIG. 7 is a schematic diagram of an example process tool for performing disclosed embodiments.
Figure 8:
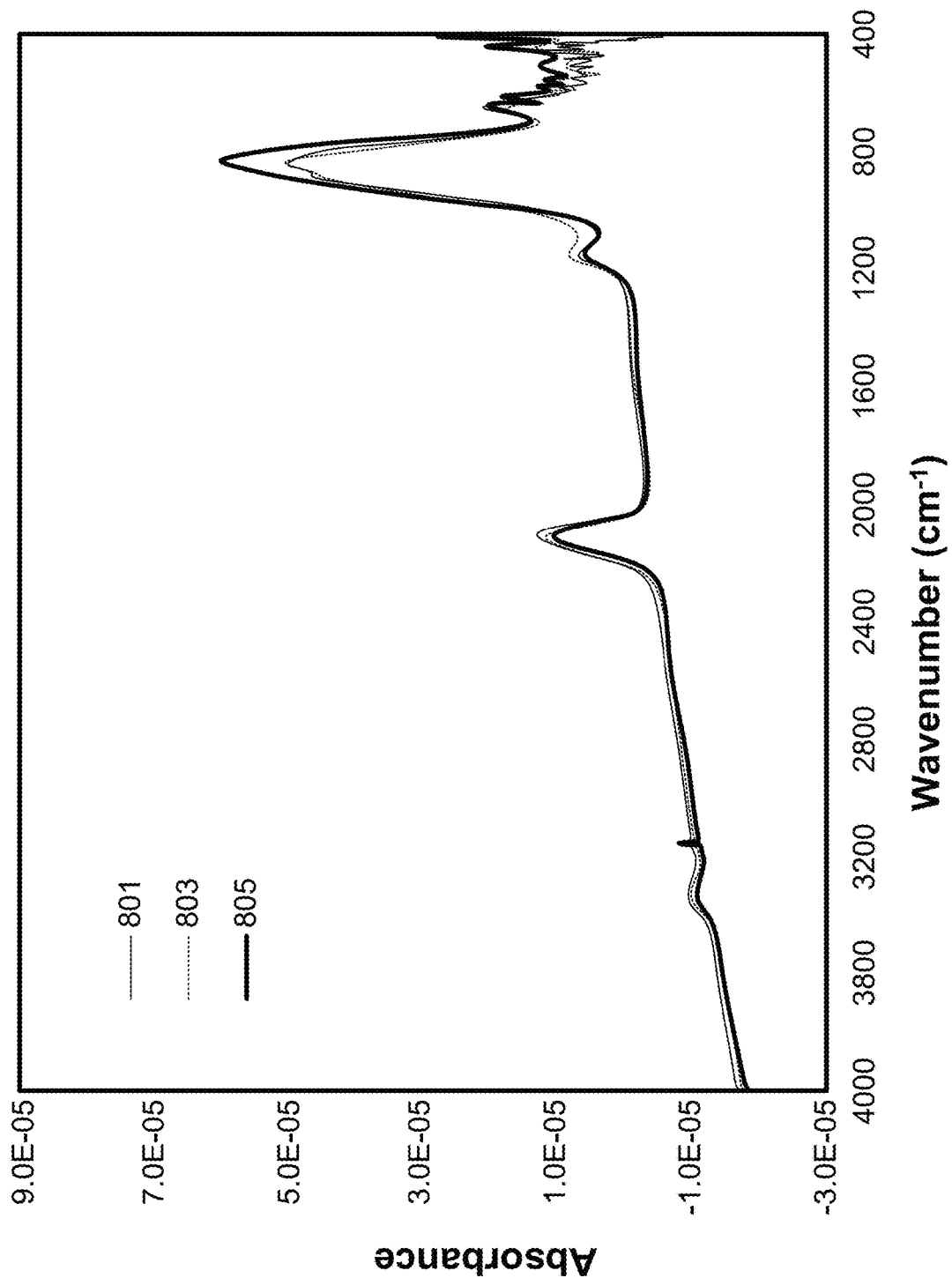
FIG. 8 is a Fourier transform infrared spectrum of films from experimental data.

As discussed above, the techniques for deposition and post-treatment of an encapsulation as discussed herein may be implemented on a multi-station or single station tool. FIG. 7 is a schematic illustration of an example of such a tool. In specific implementations, a 300 mm Lam Vector™ tool having a 4-station deposition scheme or a 200 mm Sequel™ tool having a 6-station deposition scheme may be used. In some implementations, tools for processing 450 mm substrates may be used. In various implementations, the substrates may be indexed after every deposition and/or post-deposition plasma treatment, or may be indexed after etching steps if the etching chambers or stations are also part of the same tool, or multiple depositions and treatments may be conducted at a single station before indexing substrates.

FIG. 7 shows a schematic view of an embodiment of a multi-station processing tool 700 with an inbound load lock 702 and an outbound load lock 704, either or both of which may comprise a remote plasma source. A robot 706, at atmospheric pressure, is configured to move wafers from a cassette loaded through a pod 708 into inbound load lock 702 via an atmospheric port 710. A wafer is placed by the robot 706 on a pedestal 712 in the inbound load lock 702, the atmospheric port 710 is closed, and the load lock 702 is pumped down. Where the inbound load lock 702 includes a remote plasma source, the wafer may be exposed to a remote plasma treatment in the inbound load lock 702 prior to being introduced into a processing chamber 714. Further, the wafer also may be heated in the inbound load lock 702 as well, for example, to remove moisture and adsorbed gases. In some embodiments, the wafer may be subject to a "temperature soak" as described elsewhere herein in the inbound load lock 702.

A chamber transport port 716 to processing chamber 714 is opened, and another robot (not shown) places the wafer into the reactor on a pedestal of a first station shown in the reactor for processing. While the embodiment depicted in FIG. 7 includes load locks, it will be appreciated that, in some embodiments, direct entry of a wafer into a process station may be provided.

The depicted processing chamber 714 includes four process stations, numbered from 1 to 4 in the embodiment shown in FIG. 7. Each station has a heated pedestal (shown at 718 for station 1), and gas line inlets. It will be appreciated that in some embodiments, each process station may have different or multiple purposes. For example, in some embodiments, a process station may be switchable between a PECVD deposition mode and a periodic plasma post-treatment process mode. In some embodiments, a process station may be switchable between a chemical vapor deposition (CVD) process mode and a plasma enhanced chemical vapor deposition (PECVD) process mode. In some embodiments, a process station may be switchable between a PECVD process mode and an RPCVD process mode. Additionally or alternatively, in some embodiments, processing chamber 714 may include one or more matched pairs of atomic layer deposition or plasma-enhanced atomic layer deposition process stations. While the depicted processing chamber 714 includes four stations, it will be understood that a processing chamber according to certain disclosed embodiments may have any suitable number of stations. For example, in some embodiments, a processing chamber may have five or more stations, while in other embodiments a processing chamber may have three or fewer stations.

FIG. 7 depicts an embodiment of a wafer handling system 790 for transferring wafers within processing chamber 714. In some embodiments, wafer handling system 790 may transfer wafers between various process stations and/or between a process station and a load lock. It will be appreciated that any suitable wafer handling system may be employed. Non-limiting examples include wafer carousels and wafer handling robots. FIG. 7 also depicts an embodiment of a system controller 750 employed to control process conditions and hardware states of process tool 700. System controller 750 may include one or more memory devices 756, one or more mass storage devices 754, and one or more processors 752. One or more processors 752 may include a CPU or computer, analog and/or digital input/output connections, stepper motor controller boards, etc.

In some embodiments, system controller 750 controls all of the activities of process tool 700. System controller 750 executes system control software 758 stored in mass storage device 754, loaded into memory device 756, and executed on processor 752. Alternatively, the control logic may be hard coded in the controller 750. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 758 may include instructions for controlling the timing, mixture of gases, amount of gas flow, chamber and/or station pressure, chamber and/or station temperature, wafer temperature, target power levels, RF power levels, substrate pedestal, chuck and/or susceptor position, plasma pulse frequency, plasma exposure duration, UV radiation duration, and other parameters of a particular process performed by process tool 700. System control software 758 may be configured in any suitable way. For example, various process tool component subroutines or control objects may be written to control operation of the process tool components necessary to carry out various process tool processes. System control software 758 may be coded in any suitable computer readable programming language.

In some embodiments, system control software 758 may include input/output control (IOC) sequencing instructions for controlling the various parameters described above. Other computer software and/or programs stored on mass storage device 754 and/or memory device 756 associated with system controller 750 may be employed in some embodiments. Examples of programs or sections of programs for this purpose include a substrate positioning program, a process gas control program, a pressure control program, a heater control program, UV exposure control program, and a plasma control program.

A substrate positioning program may include program code for process tool components that are used to load the substrate onto the pedestal and to control the spacing between the substrate and other parts of the process tool.

A process gas control program may include code for controlling gas composition (e.g., silicon-containing gases, germanium-containing gases, nitrogen-containing gases, carbon-containing gases, oxygen-and-carbon-containing gases, carbon-containing gases, post-treatment gases, and other gases as described herein) and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, etc.

A heater control program may include code for controlling the current to a heating unit that is used to heat the substrate. Alternatively, the heater control program may control delivery of a heat transfer gas (such as helium) to the substrate.

A plasma control program may include code for setting RF power levels applied to the process electrodes in one or more process stations in accordance with the embodiments herein.

A UV exposure control program may include code for setting duration of exposure of UV radiation in one or more process stations in accordance with the embodiments herein.

A pressure control program may include code for maintaining the pressure in the reaction chamber in accordance with the embodiments herein.

In some embodiments, there may be a user interface associated with system controller 750. The user interface may include a display screen, graphical software displays of the apparatus and/or process conditions, and user input devices such as pointing devices, keyboards, touch screens, microphones, etc.

In some embodiments, parameters adjusted by system controller 750 may relate to process conditions. Non-limiting examples include process gas composition and flow rates, temperature, pressure, plasma conditions (such as RF bias power levels), etc. These parameters may be provided to the user in the form of a recipe, which may be entered utilizing the user interface.

Signals for monitoring the process may be provided by analog and/or digital input connections of system controller 750 from various process tool sensors. The signals for controlling the process may be output on the analog and digital output connections of process tool 700. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 750 may provide program instructions for implementing the above-described deposition processes. The program instructions may control a variety of process parameters, such as DC power level, RF power level, pressure, temperature, plasma pulse frequency, plasma exposure duration, UV exposure duration, etc. The instructions may control the parameters to operate in-situ deposition of film stacks according to various embodiments described herein.

The system controller 750 will typically include one or more memory devices and one or more processors configured to execute the instructions so that the apparatus will perform a method in accordance with disclosed embodiments. Machine-readable media containing instructions for controlling process operations in accordance with disclosed embodiments may be coupled to the system controller 750.

In some implementations, a controller 750 is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller 750, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, plasma pulse frequency settings, UV exposure settings, fluid delivery settings, positional and operation settings, wafer transfers into and out of a tool and other transfer tools and/or load locks connected to or interfaced with a specific system.

Broadly speaking, the controller 750 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller 750, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller 750 receives instructions in the form of data, which specify parameters for each of the processing steps to be performed during one or more operations. It should be understood that the parameters may be specific to the type of process to be performed and the type of tool that the controller is configured to interface with or control. Thus as described above, the controller 750 may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

In some embodiments, an apparatus may be provided that is configured to perform the techniques described herein. A suitable apparatus may include hardware for performing various process operations as well as a system controller 750 having instructions for controlling process operations in accordance with the disclosed embodiments. The system controller 750 will typically include one or more memory devices and one or more processors communicatively connected with various process control equipment, e.g., valves, RF generators, substrate handling systems, etc., and configured to execute the instructions so that the apparatus will perform a technique in accordance with the disclosed embodiments, e.g., a technique such as that provided in the operations of FIGS. 2A-2C. Machine-readable media containing instructions for controlling process operations in accordance with the present disclosure may be coupled to the system controller 750. The controller 750 may be communicatively connected with various hardware devices, e.g., mass flow controllers, valves, RF generators, vacuum pumps, etc. to facilitate control of the various process parameters that are associated with the deposition operations as described herein.

In some embodiments, a system controller 750 may control all of the activities of the reactor 700. The system controller 750 may execute system control software stored in a mass storage device, loaded into a memory device, and executed on a processor. The system control software may include instructions for controlling the timing of gas flows, substrate movement, RF generator activation, etc., as well as instructions for controlling the mixture of gases, the chamber and/or station pressure, the chamber and/or station temperature, the substrate temperature, the target power levels, the RF power levels, the substrate pedestal, chuck, and/or susceptor position, and other parameters of a particular process performed by the reactor apparatus 700. For example, the software may include instructions or code for controlling the flow rate of a silicon-containing precursor, the flow rate of a reactant, the flow rate of a nitrogen-containing gas, plasma frequency, plasma pulse frequency, plasma power, UV exposure times, precursor and reactant exposure times, flow rate of post-treatment gas, and UV exposure times for each of the above described flow chemistries. The system control software may be configured in any suitable way. For example, various process tool component subroutines or control objects may be written to control operation of the process tool components necessary to carry out various process tool processes. The system control software may be coded in any suitable computer readable programming language.

The system controller 750 may typically include one or more memory devices 756 and one or more processors 752 configured to execute the instructions so that the apparatus will perform a technique in accordance with disclosed embodiments. Machine-readable media containing instructions for controlling process operations in accordance with disclosed embodiments may be coupled to the system controller 750.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

An appropriate apparatus for performing the methods disclosed herein is further discussed and described in U.S. Pat. No. 8,728,956, issued on May 20, 2014, and filed Apr. 11, 2011, and titled "PLASMA ACTIVATED CONFORMAL FILM DEPOSITION"; and U.S. patent application Ser. No. 13/084,305, filed Apr. 11, 2011, and titled "SILICON NITRIDE FILMS AND METHODS," each of which is incorporated herein in its entireties.

The apparatuses and processes described herein may be used in conjunction with lithographic patterning tools or processes, for example, for the fabrication or manufacture of semiconductor devices, displays, LEDs, photovoltaic panels and the like. Typically, though not necessarily, such tools/ processes will be used or conducted together in a common fabrication facility. Lithographic patterning of a film typically includes some or all of the following operations, each operation enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

EXPERIMENTAL

Experiment 1

An experiment was conducted for deposition of a silicon nitride (SiN) encapsulation layers. A first substrate including a 4:1 aspect ratio feature was exposed to silane ($SiH_4$) and a mixture of nitrogen and ammonia ($N_2/NH_3$) to deposit a SiN encapsulation layer. The step coverage achieved for the first substrate was 40%.

Figure 9:
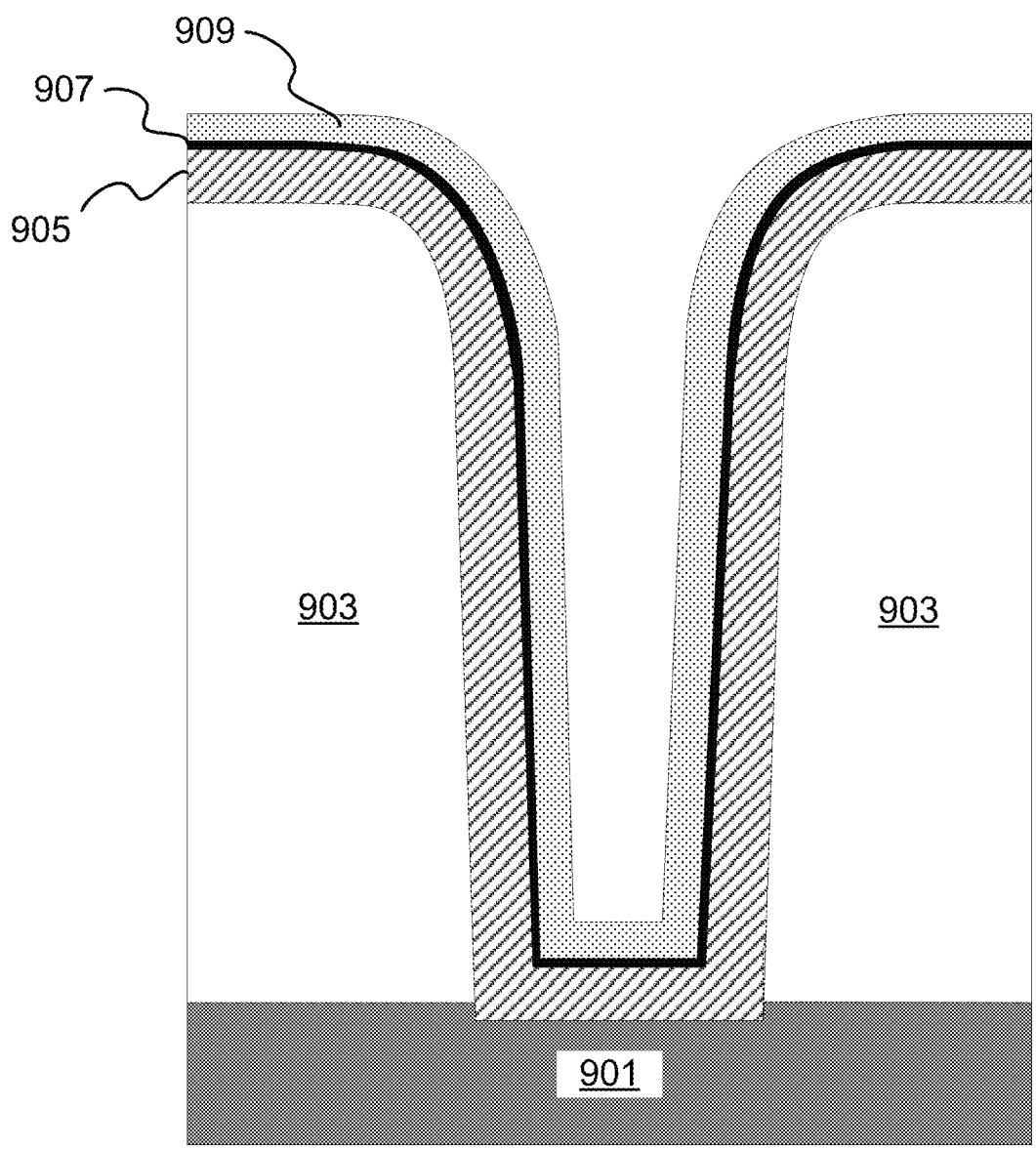
FIG. 9 is a schematic illustration of a substrate with an encapsulation layer deposited in an experiment conducted in accordance with disclosed embodiments.

A second substrate including a 4:1 aspect ratio feature was exposed to $SiH_4$ and $N_2/NH_3$ continuously at 300° C. while plasma was pulsed between 0 W and 500 W at a pulse frequency of 0.02 ms on and 1.98 ms off and a plasma frequency of 13.56 MHz to deposit a 300 Å SiN encapsulation layer. The deposited film's bottom-to-top ratio was 68% and sidewall-to-top ratio was 71%. An example of the resulting substrate is shown in FIG. 9. FIG. 9 includes a substrate 901 with TEOS 903 and an SiN layer 905 deposited at low pressure and a silicon oxide film 907 deposited by ALD. The silicon nitride layer 909 deposited by pulsed plasma PECVD as described herein is deposited conformally with a high step coverage of 70% over the substrate.

Experiment 2

An experiment was conducted involving exposing a non-pulsed PECVD-deposited SiN encapsulation layer to periodic plasma post-treatment. A substrate including a deposited SiN encapsulation layer, which was deposited by non-pulsed PECVD, was exposed to plasma with argon/helium post-treatment gas for a post-treatment operation for a duration of 30 seconds at a power of 2000 W and a plasma frequency of 13.56 MHz. The substrate was exposed to the following sequence of exposures: (a) plasma on for 0.02 ms, (b) plasma off for 1.98 ms, (c) repeat (a) and (b), (d) post-treatment using 10 s-60 s inert plasma, and (e) repeat (a)-(d).

Figure 10:
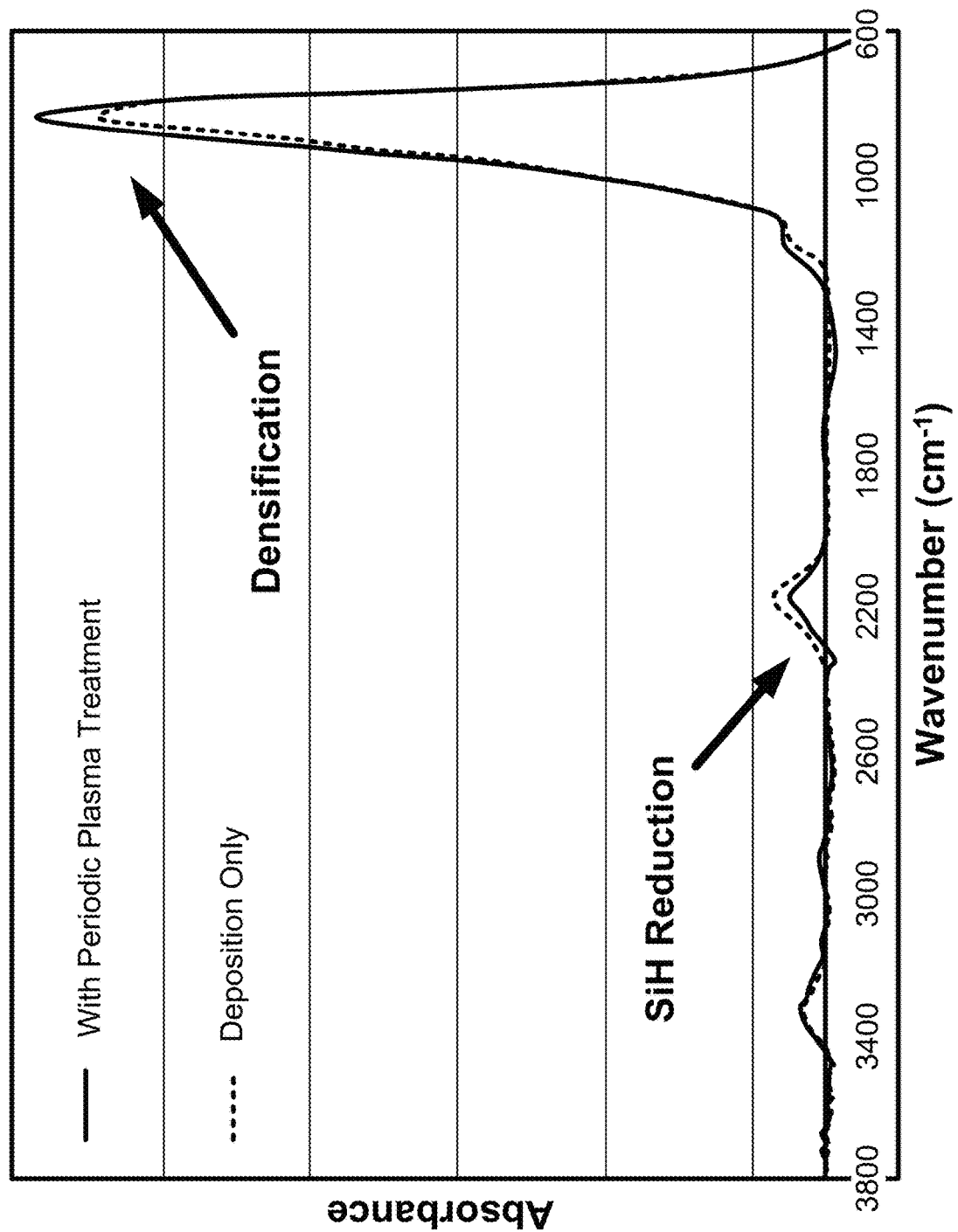
FIG. 10 is a Fourier transform infrared spectrum of films from experimental data.

The FTIR spectra for both the substrate with deposition only (dotted line) and the substrate with periodic plasma treatment (solid line) are shown in FIG. 10. As shown, the solid line shows a reduction in Si—H bonds, which suggests a reduction in hydrogen content, and an increased densification peak, both of which indicate a higher quality film resulting from the periodic plasma treatment.

Experiment 3

Figure 11:
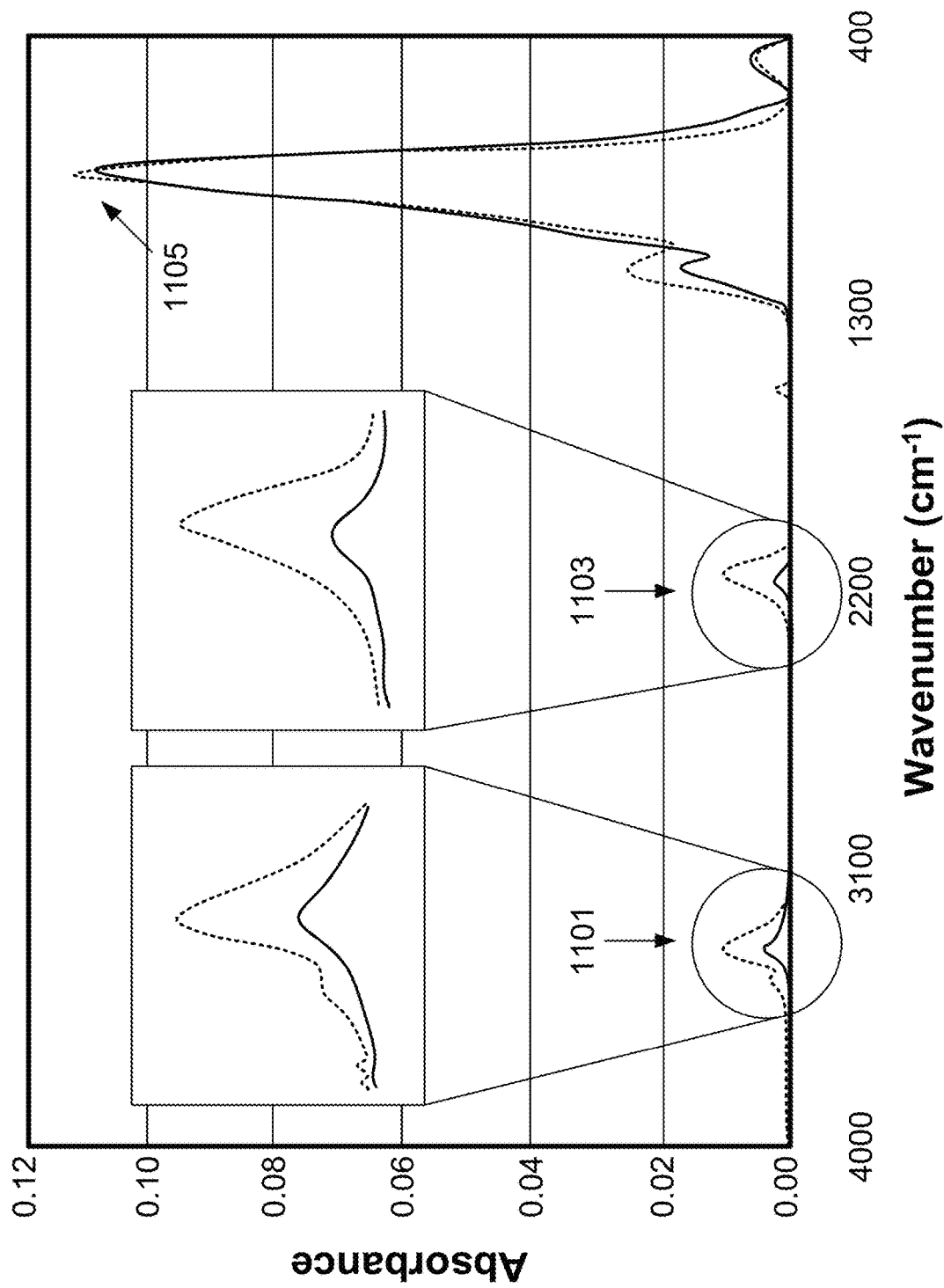
FIG. 11 is a Fourier transform infrared spectrum of films from experimental data.

An experiment was conducted for exposing a non-pulsed PECVD-deposited SiN encapsulation layer to UV exposure post-treatment. A substrate including a deposited SiN encapsulation layer, which was deposited by non-pulsed PECVD, was exposed to UV radiation at a wavelength of 180 nm to 600 nm for a duration of 300 seconds at a temperature of 300° C. The FTIR spectra for both the substrate with deposition only (solid line) and the substrate with UV treatment (dotted line) are shown in FIG. 11. As shown, the dotted line shows a reduction in N—H bonds at 1101, which suggests a reduction in hydrogen content; a reduction in Si—H bonds at 1103, which also suggests a reduction in hydrogen content; and an increased densification peak at 1105. These characteristics suggest that a higher quality film resulted from the UV treatment.

Experiment 4

An experiment was conducted for deposition of encapsulation layers using remote plasma chemical vapor deposition at 250° C.

An encapsulation layer was deposited on a first substrate including a 4:1 aspect ratio feature in an RPCVD chamber including a showerhead by introducing nitrogen radicals from a remote plasma to the substrate with a silane delivered to the substrate downstream of the showerhead with the pedestal holding the substrate set to a temperature of 250° C. The step coverage of the deposited film was greater than 80%.

Figure 12A:
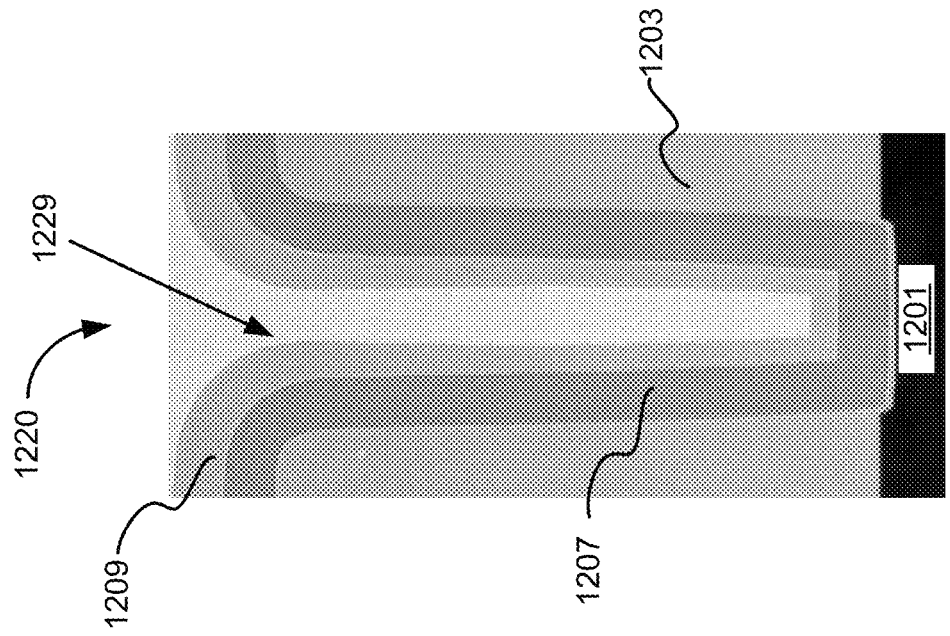
FIGS. 12A and 12B are images of substrate with an encapsulation layer deposited in an experiment conducted in accordance with disclosed embodiments.

A SiCO encapsulation layer deposited on a second substrate including a 7:1 aspect ratio feature in an RPCVD chamber including a showerhead by introducing radicals from a remote plasma to the substrate with a silicon-containing precursor delivered to the substrate downstream of the showerhead with the pedestal holding the substrate set to a temperature of 250° C. FIG. 12A shows the substrate before performing a wet etch rate experiment. Substrate 1200 with an underlayer 1201 and TEOS 1203, with a SiN layer 1207 deposited at low pressure and SiCO encapsulation layer 1209 deposited conformally over the substrate. Note the conformality shown at arrow 1219.

Figure 12B:
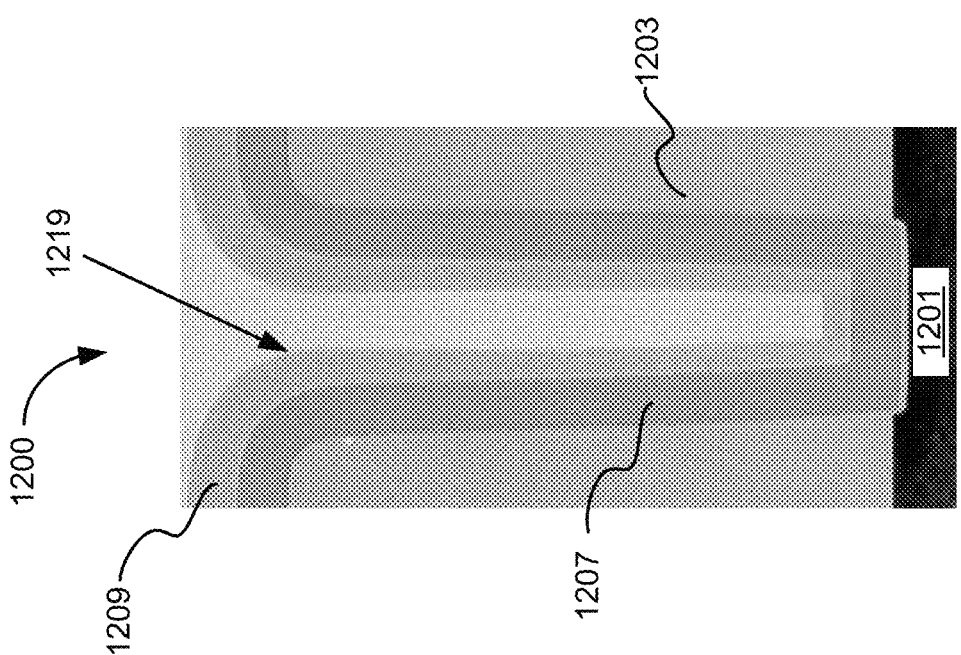

The substrate was exposed to a 100:1 diluted HF solution for 5 minutes. FIG. 12B shows the substrate 1220 after this exposure. As shown, the top of the feature and at the sidewalls as indicted by arrow 1229 showed no etching, thereby suggesting that the wet etch rate is nearly 0 for the deposited encapsulation layer 1209.

Experiment 5

Figure 13A:
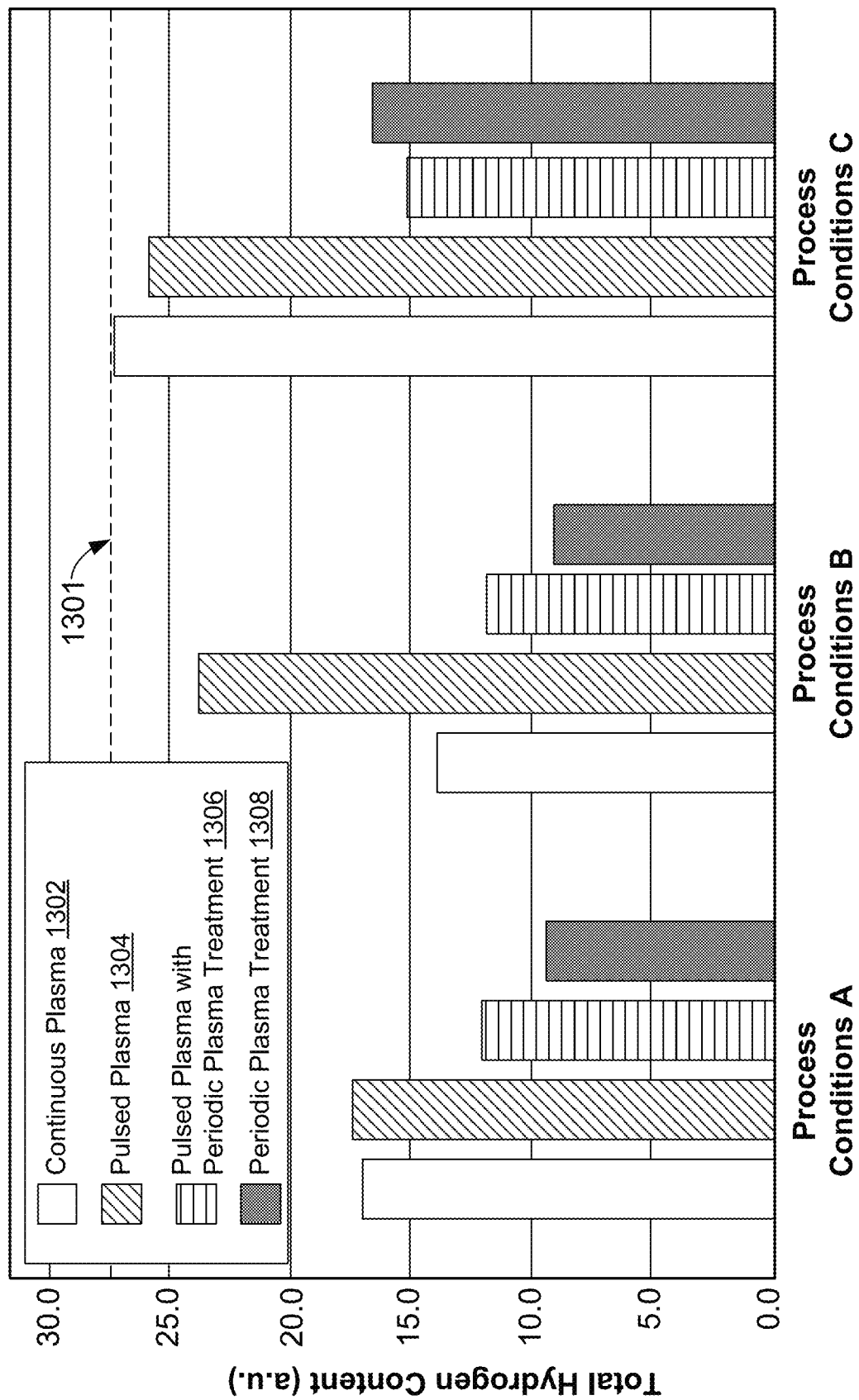
FIG. 13A is a graph of hydrogen content of various encapsulation layers deposited in an experiment.
Figure 13B:
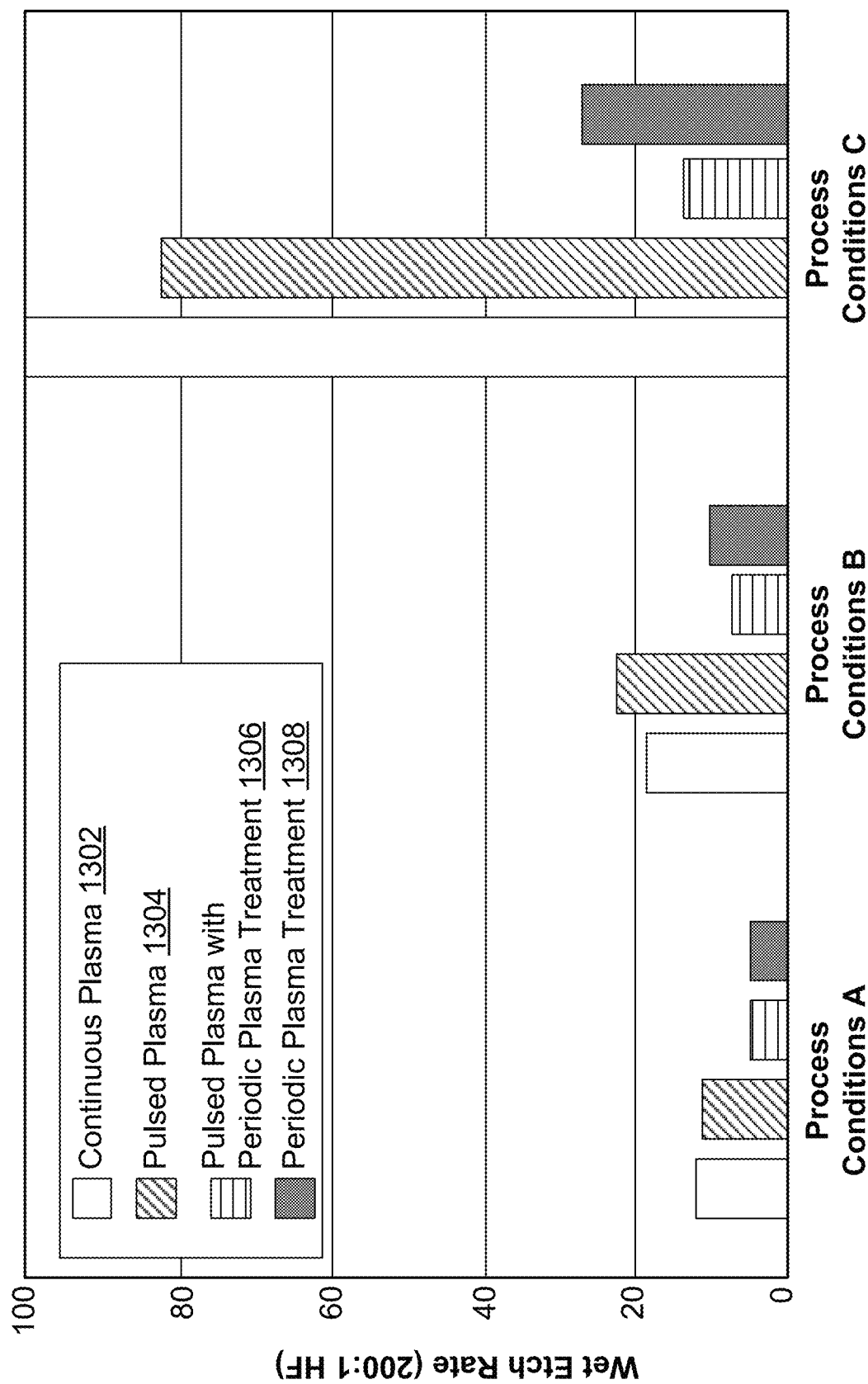
FIG. 13B is a graph of wet etch rate of various encapsulation layers deposited in an experiment.

An experiment was conducted for encapsulation layers deposited by various methods. Substrates were subjected to four methods of deposition. The first method involved exposure to continuous plasma using conventional PECVD (continuous exposure to silicon-containing precursor and second reactant with continuous plasma) with no post-treatment. Plasma power was set to 500 W with a plasma frequency of 13.5 MHz. This method is indicated in FIGS. 13A and 13B as the white bars (1302).

The second method involved pulsed PECVD (continuous exposure to silicon-containing precursor and second reactant with pulsed plasma) with no post-treatment. Plasma was pulsed between 0 W and 500 W with duty cycle of 10% with pulsing frequency of 500 Hz. This method is indicated in FIGS. 13A and 13B as the diagonally striped bars (1304).

The third method involved pulsed PECVD (continuous exposure to silicon-containing precursor and second reactant with pulsed plasma) with periodic plasma post-treatment. Plasma during pulsed plasma deposition was pulsed using 0.2 ms RF on/1.8 ms RF off pulses between 0 W and 500 W at a pulse frequency of 500 Hz. Plasma during periodic plasma post-treatment was turned on for a duration of 60 seconds at a plasma power of 2000 W (4-station, power density=0.6 W/cm$^2$) and plasma frequency of 13.56 MHz. This method is indicated in FIGS. 13A and 13B as the horizontally striped bars (1306).

The fourth method involved exposure to continuous plasma using conventional PECVD (continuous exposure to silicon-containing precursor and second reactant with continuous plasma) with periodic plasma post-treatment. Plasma power was set to 500 W with a plasma frequency of 13.56 MHz. Film was deposited using continuous plasma for few seconds to deposit 25 Å-30 Å. This film was then exposed to periodic plasma post-treatment which was turned on for a duration of 60 seconds at a plasma power of 2000 W and plasma frequency of 13.56 MHz. This cycle was repeated until the entire film thickness was achieved. This method is indicated in FIGS. 13A and 13B as the shaded bars (1308).

The process conditions for Process Conditions A, B, and C as indicated in FIGS. 13A and 13B, are outlined in Table 1 below.

TABLE 1

Process Conditions for Deposition Portion

|  | A | B | C |
|---|---|---|---|
| Precursor | SiH$_4$ 800 sccm | SiH$_4$ 75 sccm | SiH$_4$ 100 sccm |
| Reactant | NH$_3$ 800 sccm | NH$_3$ 50 sccm | NH$_3$ 2125 sccm |
|  | N$_2$ = 20000 | N$_2$ = 16000 | N$_2$ = 16000 |
| Film Deposited | SiN | SiN | SiN |
| Inert/Carrier Gas | None | None | None |
| Substrate Temperature | 300° C. | 400° C. | 400° C. |
| Chamber Pressure | 1.5 Torr | 7 Torr | 9 Torr |
| HF 13.5 MHz | Yes | Yes | Yes |
| LF 400 KHz | Yes | No | No |

FIG. 13A shows the resulting hydrogen content for substrates exposed to each set of process conditions and deposited by each of the four methods. For Process Conditions A, the hydrogen content for the substrate subjected to periodic plasma treatment was less than that of pulsed plasma with periodic plasma treatment, and both the hydrogen content for these two methods were less than the hydrogen content of substrates subjected to continuous plasma and pulsed plasma without post-treatment. This suggests that periodic plasma post-treatment reduces hydrogen content, and further that pulsed plasma with post-treatment may be a viable and suitable option in some embodiments.

For Process Conditions B, hydrogen content for the substrate subjected to pulsed plasma was the highest, which suggests that at high temperature (400° C.), pulsed plasma may not be suitable in some embodiments, but the combination of pulsed plasma with periodic plasma treatment substantially decreased the hydrogen content. Periodic plasma treatment alone also resulted in a low hydrogen content. These results suggest that the combination of pulsed plasma deposition with periodic plasma treatment, or periodic plasma treatment alone can result in a low hydrogen content film even if deposited at 400° C.

For Process Conditions C, hydrogen content for both continuous plasma and pulsed plasma substrates were high, but combining either of those with periodic plasma treatment resulted in a substantial decrease of hydrogen content, which further supports that for some embodiments, even if substrates are deposited at 400° C., periodic plasma treatment may be suitable for reducing hydrogen content. The results indicate that post-treatment reduces the hydrogen content and wet etch rate.

FIG. 13B shows the resulting wet etch rate for each of the substrates in FIG. 13A when subjected to a 200:1 hydrogen fluoride etchant. For Process Conditions A, the wet etch rate for substrates with encapsulation layers deposited by pulsed plasma, pulsed plasma with periodic plasma treatment, and periodic plasma treatment were lower than the wet etch rate of the substrate with an encapsulation layer deposited by continuous plasma. The wet etch rate for encapsulation layers deposited and subjected to periodic plasma treatment was even lower than that of pulsed plasma deposited encapsulation layers without post-treatment. A lower wet etch rate suggests that the quality of the film is higher and thus can withstand exposure to harsher conditions in subsequent processing, thereby allowing the encapsulation layer to effectively protect an underlying memory stack.

For Process Conditions B, a similar trend is shown, as encapsulation layers that were also subjected to periodic plasma treatment resulted in a lower wet etch rate than layers that did not undergo post-treatment. Likewise, for Process Conditions C, a similar trend is also shown, with the wet etch rate for encapsulation layers deposited and subjected to periodic plasma treatment having a substantially lower wet etch rate than layers that were not subjected to periodic plasma treatment.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method of encapsulating a memory device on a substrate in a process chamber, the method comprising:
    exposing the substrate having the memory device housed in the process chamber to a deposition precursor at a substrate temperature less than 300° C.; and
    generating a reactive species in a remote plasma generator;
    introducing the reactive species to the process chamber to react with the deposition precursor to deposit an encapsulation layer over the memory device; and
    exposing the encapsulation layer to a post-treatment process to form a hermetic encapsulation layer.

2. The method of claim 1, wherein the post-treatment process is performed at a temperature less than 300° C.

3. The method of claim 1, wherein the encapsulation layer is selected from the group consisting of silicon nitride, undoped silicon carbide, oxygen-doped silicon carbide, germanium nitride, undoped germanium carbide, and oxygen-doped germanium carbide.

4. The method of claim 1, wherein the encapsulation layer is deposited by remote plasma enhanced chemical vapor deposition.

5. The method of claim 4, wherein remote plasma enhanced chemical vapor deposition comprises:

(a) flowing a reactant to a remote plasma-generating region and igniting the plasma to generate the reactive species comprising reactant radicals;

(b) introducing the reactant radicals through a showerhead to the substrate; and (c) introducing the deposition precursor downstream of the showerhead to the substrate while introducing the reactant radicals.

6. The method of claim 1, wherein the post-treatment process comprises exposing the substrate to a post-treatment gas and igniting a second plasma without a reactant.

7. The method of claim 6, wherein the substrate is exposed to the post-treatment gas and the second plasma for a duration between about 10 seconds and about 50 seconds.

8. The method of claim 6, wherein the post-treatment gas is selected from the group consisting of nitrogen, ammonia, helium, argon, and combinations thereof.

9. The method of claim 1, wherein the memory device is a magnetoresistive random-access memory.

10. The method of claim 1, wherein the memory device comprises a magnetic tunnel junction.

11. The method of claim 1, wherein the encapsulation layer is deposited to a thickness between about 50 Å and about 500 Å.

12. The method of claim 1, wherein the encapsulation layer is deposited by plasma enhanced chemical vapor deposition.

13. The method of claim 1, wherein the encapsulation layer deposited over the memory device has a step coverage between about 70% and about 90%.

14. The method of claim 1, wherein the encapsulation layer is a silicon nitride film deposited by exposing the substrate to a silicon-containing precursor and a nitrogen-containing reactant.

15. The method of claim 1, wherein the encapsulation layer is a silicon oxycarbide film deposited by exposing the substrate to a silicon-and carbon-and-oxygen-containing precursor and hydrogen.

16. The method of claim 1, further comprising prior to depositing the encapsulation layer, heating the substrate to a temperature of about 300° C.

17. The method of claim 1, wherein the reactive species comprises nitrogen and an inert gas.

* * * * *